United States Patent
Wang et al.

(10) Patent No.: US 11,637,593 B2
(45) Date of Patent: Apr. 25, 2023

(54) MACHINE TYPE COMMUNICATION (MTC) CONFIGURATION, INTERFERENCE MANAGEMENT, AND RETUNING TIME FOR UPLINK TRANSMISSIONS

(71) Applicant: QUALCOMM Incorporated, San Diego, CA (US)

(72) Inventors: Renqiu Wang, San Diego, CA (US); Hao Xu, San Diego, CA (US); Wanshi Chen, San Diego, CA (US); Peter Gaal, San Diego, CA (US); Yongbin Wei, La Jolla, CA (US)

(73) Assignee: QUALCOMM Incorporated, San Diego, CA (US)

( * ) Notice: Subject to any disclaimer, the term of this patent is extended or adjusted under 35 U.S.C. 154(b) by 693 days.

(21) Appl. No.: 15/202,901

(22) Filed: Jul. 6, 2016

(65) Prior Publication Data
US 2017/0033843 A1     Feb. 2, 2017

Related U.S. Application Data

(60) Provisional application No. 62/233,912, filed on Sep. 28, 2015, provisional application No. 62/190,716, filed on Jul. 9, 2015.

(51) Int. Cl.
*H04W 72/04*     (2023.01)
*H04B 7/04*     (2017.01)
(Continued)

(52) U.S. Cl.
CPC ............ *H04B 7/04* (2013.01); *H04B 17/382* (2015.01); *H04L 5/0048* (2013.01);
(Continued)

(58) Field of Classification Search
CPC ............ H04W 72/04; H04W 72/0406; H04W 72/0413; H04W 72/0453; H04W 4/70;
(Continued)

(56) References Cited

U.S. PATENT DOCUMENTS

2006/0221789 A1* 10/2006 Yoshimoto ........... G11B 7/0953
                                          369/47.45
2007/0280167 A1* 12/2007 Olexa .................. G01S 5/0205
                                          370/331
(Continued)

FOREIGN PATENT DOCUMENTS

| CN | 103188051 A | 7/2013 |
|----|-------------|--------|
| CN | 103188176 A | 7/2013 |

(Continued)

OTHER PUBLICATIONS

R1-152505, "PUCCH transmission for MTC", May 25-29, 2015, pp. 1-6 (Year: 2015).*

(Continued)

*Primary Examiner* — Salvador E Rivas
(74) *Attorney, Agent, or Firm* — Patterson & Sheridan, LLP

(57) ABSTRACT

Certain aspects of the present disclosure generally relate to wireless communications, and more specifically increasing user capacity through a frame structure which supports enhanced Machine Type Communication (eMTC) UL multi-user multiplexing. For example, a User Equipment (UE) identifies at least one narrowband region within a wider system bandwidth. The UE receives signaling, from a base station, indicating a sub-region of the narrowband region assigned to the UE for transmitting symbols of a physical uplink channel that are multiplexed with symbols transmitted by one or more other UEs in the narrowband region. The UE transmits the physical uplink channel in the assigned (Continued)

sub-region. Similar techniques are also provided that may be applied to DL multi-user multiplexing.

53 Claims, 14 Drawing Sheets

(51) Int. Cl.

| | | |
|---|---|---|
| *H04W 4/70* | (2018.01) | |
| *H04L 5/00* | (2006.01) | |
| *H04B 17/382* | (2015.01) | |
| *H04L 47/70* | (2022.01) | |
| *H04W 28/02* | (2009.01) | |
| *H04B 7/06* | (2006.01) | |
| *H03M 13/15* | (2006.01) | |
| *H04W 88/02* | (2009.01) | |

(52) U.S. Cl.
CPC ............ *H04L 5/0053* (2013.01); *H04L 47/70* (2013.01); *H04W 4/70* (2018.02); *H04W 28/0215* (2013.01); *H04W 72/04* (2013.01); *H03M 13/15* (2013.01); *H04B 7/0678* (2013.01); *H04W 88/02* (2013.01)

(58) Field of Classification Search
CPC .... H04W 28/0215; H04W 88/02; H04B 7/04; H04B 17/382; H04B 7/0678; H04L 5/0053; H04L 5/0048; H04L 47/70; H03M 13/15
See application file for complete search history.

(56) References Cited

U.S. PATENT DOCUMENTS

| | | | | |
|---|---|---|---|---|
| 2008/0273614 | A1* | 11/2008 | Heegard | H04L 25/4919 375/260 |
| 2009/0189071 | A1* | 7/2009 | Chernushevich | H01J 49/062 250/282 |
| 2009/0231993 | A1* | 9/2009 | Zhang | H04L 27/2607 370/210 |
| 2010/0189032 | A1 | 7/2010 | Chen et al. | |
| 2012/0044890 | A1* | 2/2012 | Jen | H04L 5/0053 370/329 |
| 2013/0010743 | A1* | 1/2013 | Ahn | H04L 1/1621 370/329 |
| 2013/0083753 | A1 | 4/2013 | Lee et al. | |
| 2013/0156003 | A1* | 6/2013 | Liang | H04L 5/0053 370/330 |
| 2013/0315188 | A1* | 11/2013 | Pajukoski | H04B 17/24 370/329 |
| 2014/0348089 | A1 | 11/2014 | Lv et al. | |
| 2015/0016312 | A1* | 1/2015 | Li | H04W 74/006 370/280 |
| 2015/0078224 | A1* | 3/2015 | Xiong | H04L 5/0055 370/280 |
| 2015/0271814 | A1* | 9/2015 | Park | H04B 7/04 370/329 |
| 2015/0334693 | A1* | 11/2015 | Lu | H04W 72/04 370/329 |
| 2016/0127936 | A1* | 5/2016 | Chatterjee | H04B 7/0626 370/252 |
| 2016/0212663 | A1* | 7/2016 | Uemura | H04W 48/16 |
| 2016/0269939 | A1* | 9/2016 | Papasakellariou | H04L 1/00 |
| 2016/0337157 | A1* | 11/2016 | Papasakellariou | H04B 3/232 |
| 2016/0353440 | A1* | 12/2016 | Lee | H04W 72/0453 |
| 2017/0245265 | A1* | 8/2017 | Hwang | H04L 27/2601 |
| 2017/0374574 | A1* | 12/2017 | Lee | H04W 24/08 |
| 2018/0063722 | A1* | 3/2018 | Lee | H04L 1/08 |
| 2018/0124618 | A1* | 5/2018 | You | H04L 5/0048 |
| 2019/0191454 | A1* | 6/2019 | Blankenship | H04W 74/004 |
| 2019/0230628 | A1* | 7/2019 | Chen | H04W 4/70 |
| 2019/0342813 | A1* | 11/2019 | Fasil Abdul | H04W 16/10 |

FOREIGN PATENT DOCUMENTS

| | | |
|---|---|---|
| CN | 104254997 A | 12/2014 |
| CN | 104349476 A | 2/2015 |
| CN | 104737485 A | 6/2015 |
| JP | 2015507889 A | 3/2015 |
| JP | 2017519401 A | 7/2017 |

OTHER PUBLICATIONS

The 3GPP document, "ETSI TS 136 213 V10.10.0", Jul. 2013, pp. 1-128 (Year: 2013).*
Ericsson: "PUCCH Transmission for MTC", 3GPP Draft, R1-152505 PUCCH Resource Allocation For MTC, 3rd Generation Partnership Project (3GPP), Mobile Competence Centre, 650, Route Des Lucioles, F-06921 Sophia-Antipolis Cedex, France, vol. RAN WG1, No. Fukuoka, Japan, May 25, 2015- May 29, 2015, May 16, 2015 (May 16, 2015), pp. 1-6, XP050973644, Retrieved from the Internet: URL: http://www.3gpp.org/ftp/tsg_ran/WG1_RL1/TSGR1_81/Docs/ [retrieved on May, 16, 2015].
International Search Report and Written Opinion—PCT/US2016/041338—ISA/EPO—dated Sep. 23, 2016.
NSN, et al., "Bandwidth Reduction for Low-Cost MTC UEs", 3GPP Draft, R1-133480, 3rd Generation Partnership Project (3GPP), Mobile Competence Centre, 658, Route Des Lucioles, F-86921 Sophia-Anti polis Cedex, France, vol. RAN WG1, No. Barcelona, Spain, Aug. 19, 2013-Aug. 23, 2013, Aug. 10, 2013 (Aug. 10, 2013), 6 Pages, XP050716587, Retrieved from the Internet: URL:http://www.3gpp.org/ftp/tsg_ran/WG1_RL1/TSGR1_74/Docs/ [retrieved on Aug. 10, 2013].
Qualcomm Inc: "Physical Uplink Control Channels", 3GPP Draft, R1-157024 Physical Uplink Control Channels, 3rd Generation Partnership Project (3GPP), Mobile Competence Centre, 650, Route Des Lucioles, F-06921 Sophia-Antipolis Cedex, France, vol. RAN WG1, No. Anaheim, USA, Nov. 15, 2015-Nov. 22, 2015, Nov. 15, 2015 (Nov. 15, 2015), pp. 1-4, XP051003327, Retrieved from the Internet: URL: http://www.3gpp.org/ftp/Meetings_3GPP_SYNC/RAN1/Docs/ Y[retrieved on Nov. 15, 2015].
Taiwan Search Report—TW105121606—TIPO—dated May 7, 2020.
Huawei, Hisilicon: "Frequency hopping of PUCCH" [online], 3GPP TSG RAN WG1 Meeting #81, R1-153210, May 16, 2015, 5 Pages, Retrieved from the Internet: URL:http://www.3gpp.org/ftp/tsg_ran/WG1_RL1/TSGR1_81/Docs/R1-153210.zip.
Intel Corporation: "Enhancements to PUCCH for MTC" [online], 3GPP TSG RAN WG1 Meeting #81, R1-152618, May 16, 2015, pp. 1-5, Retrieved from the Internet: URL:http://www.3gpp.org/ftp/tsg_ran/WG1_RL1/TSGR1_81/Docs/R1-152618.zip.
NEC: "Performance of Uplink Frequency Hopping for LTE Rel-13 MTC", [online] 3GPP TSGR1_80 Draft, 3GPP TSG-RAN WG1#80, R1-150288, 3rd Generation Partnership Project (3GPP), Mobile Competence Centre, 650, Route Des Lucioles, F-06921 Sophia-Antipolis Cedex, France, vol. RAN WG1, No. Athens, Greece, Feb. 9, 2015-Feb. 13, 2015, Feb. 8, 2015 (Feb. 8, 2015), XP050933498, 4 Pages, Retrieved from the Internet: URL: http://www.3gpp.org/ftp/Meetings_3GPP_SYNC/RAN1/Docs/ [retrieved on Feb. 8, 2015].
Qualcomm Incorporated: "Physical Uplink Control Channels" [online], 3GPP TSG RAN WG1 #81, R1-152766, May 16, 2015, pp. 1-4, Retrieved from the Internet: URL:http://www.3gpp.org/ftp/tsg_ran/WG1_RL1/TSGR1_81/Docs/R1-152766.zip.
Qualcomm Incorporated: "Physical Uplink Control Channels" [online], 3GPP TSG RAN WG1 #81, R1-153849, Aug. 15, 2015, pp. 1-4. Retrieved from the Internet: URL:http://www.3gpp.org/ftp/tsg_ran/WG1_RL1/TSGR1_82/Docs/R1-153849.zip.

* cited by examiner

MACHINE TYPE COMMUNICATION (MTC) CONFIGURATION, INTERFERENCE MANAGEMENT, AND RETUNING TIME FOR UPLINK TRANSMISSIONS

CLAIM OF PRIORITY UNDER 35 U.S.C. § 119

This application claims priority to U.S. Provisional Application Ser. No. 62/190,716, entitled "MACHINE TYPE COMMUNICATION (MTC) CONFIGURATION INTERFERENCE MANAGEMENT, AND RETUNING TIME FOR UPLINK TRANSMISSION", filed on Jul. 09, 2015, U.S. Provisional Application Ser. No. 62/233,912, entitled "MACHINE TYPE COMMUNICATION (MTC) CONFIGURATION, INTERFERENCE MANAGEMENT, AND RETUNING TIME FOR UPLINK TRANSMISSIONS", filed on Sep. 28, 2015, which are expressly incorporated by reference herein in their entirety.

BACKGROUND

I. Field of the Invention

Certain aspects of the present disclosure generally relate to wireless communications, and more specifically to techniques to manage uplink transmissions from multiple machine type communication (MTC) devices and enhanced MTC (eMTC) devices.

II. Description of Related Art

Wireless communication systems are widely deployed to provide various types of communication content such as voice, data, and so on. These systems may be multiple-access systems capable of supporting communication with multiple users by sharing the available system resources (e.g., bandwidth and transmit power). Examples of such multiple-access systems include code division multiple access (CDMA) systems, time division multiple access (TDMA) systems, frequency division multiple access (FDMA) systems, 3rd Generation Partnership Project (3GPP) Long Term Evolution (LTE) including LTE-Advanced systems and orthogonal frequency division multiple access (OFDMA) systems.

Generally, a wireless multiple-access communication system can simultaneously support communication for multiple wireless terminals. Each terminal communicates with one or more base stations via transmissions on the forward and reverse links. The forward link (or downlink) refers to the communication link from the base stations to the terminals, and the reverse link (or uplink) refers to the communication link from the terminals to the base stations. This communication link may be established via a single-input single-output, multiple-input single-output or a multiple-input multiple-output (MIMO) system.

A wireless communication network may include a number of base stations that can support communication for a number of wireless devices. Wireless devices may include user equipments (UEs). Some examples of UEs may include cellular phones, smart phones, personal digital assistants (PDAs), wireless modems, handheld devices, tablets, laptop computers, netbooks, smartbooks, ultrabooks, etc. Some UEs may be considered machine-type communication (MTC) UEs and/or evolved MTC UEs, which may include remote devices, such as sensors, meters, monitors, location tags, drones, trackers, robots, etc., that may communicate with a base station, another remote device, or some other entity. MTC may refer to communication involving at least one remote device on at least one end of the communication and may include forms of data communication which involve one or more entities that do not necessarily need human interaction. MTC UEs and eMTC UEs may include UEs that are capable of MTC communications with MTC servers and/or other MTC devices through Public Land Mobile Networks (PLMN), for example.

SUMMARY

The systems, methods, and devices of the disclosure each have several aspects, no single one of which is solely responsible for its desirable attributes. Without limiting the scope of this disclosure as expressed by the claims which follow, some features will now be discussed briefly. After considering this discussion, and particularly after reading the section entitled "Detailed Description" one will understand how the features of this disclosure provide advantages that include improved communications between access points and stations in a wireless network.

Certain aspects of the present disclosure provide a method for wireless communications by a user equipment (UE). The method generally includes identifying at least one narrowband region within a wider system bandwidth, receiving signaling, from a base station, indicating a sub-region of the narrowband region assigned to the UE for transmitting symbols of a physical uplink channel that are multiplexed with symbols transmitted by one or more other UEs in the narrowband region, and transmitting the physical uplink channel in the assigned sub-region.

Certain aspects of the present disclosure provide a method for wireless communications by a base station (e.g., an eNB). The method generally includes identifying at least one narrowband region within a wider system bandwidth, signaling, to a user equipment (UE), an indication of a sub-region of the narrowband region assigned to the UE for transmitting symbols of a physical uplink channel that are multiplexed with symbols transmitted by one or more other UEs in the narrowband region, and receiving the physical uplink channel in the assigned sub-region.

Certain aspects of the present disclosure provide a method for wireless communications by a UE. The method generally includes identifying at least one narrowband region within a wider system bandwidth, receiving signaling, from a base station, indicating a sub-region of the narrowband region assigned to the UE for receiving symbols of at least one physical downlink channel that are multiplexed with symbols transmitted by one or more other UEs in the narrowband region, and receiving the physical downlink channel in the assigned sub-region.

Certain aspects of the present disclosure provide a method for wireless communications by a base station (e.g., eNB). The method generally includes identifying at least one narrowband region within a wider system bandwidth, signaling, to a user equipment (UE), an indication of a sub-region of the narrowband region assigned to the UE for receiving symbols of a physical downlink channel that are multiplexed with symbols transmitted by one or more other UEs in the narrowband region, and transmitting the physical downlink channel in the assigned sub-region.

Numerous other aspects are provided including methods, apparatus, systems, computer program products, and processing systems.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

DETAILED DESCRIPTION

Aspects of the present disclosure provide techniques and apparatus for enhancing coverage for devices with limited communication resources, such as machine type communication (MTC) devices, enhanced MTC (eMTC) devices, etc. The aspects include enhancements to facilitate a frame structure for uplink multi-user multiplexing. A design challenge for eMTC devices may exist based, at least in part, on narrowband regions not having enough dimensions (e.g., only a few RBs) to easily support multiple users.

As will be described in more detail herein, aspects of the present disclosure may increase user capacity while remaining consistent with LTE numerology, provide a flexible spreading factor adjustment for balancing user capacity and data rates, improve tracking loop with eNB scheduling, provide orthogonality between users, and improve user capacity without reducing a data rate or transport block size.

The techniques described herein may be used for various wireless communication networks such as Code Division Multiple Access (CDMA) networks, Time Division Multiple Access (TDMA) networks, Frequency Division Multiple Access (FDMA) networks, Orthogonal FDMA (OFDMA) networks, Single-Carrier FDMA (SC-FDMA) networks, etc. The terms "network" and "system" are often used interchangeably. A CDMA network may implement a radio technology such as Universal Terrestrial Radio Access (UTRA), cdma2000, etc. UTRA includes Wideband-CDMA (W-CDMA), Time Division Synchronous CDMA (TD-SCDMA), and other variants of CDMA. cdma2000 covers IS-2000, IS-95 and IS-856 standards. A TDMA network may implement a radio technology such as Global System for Mobile Communications (GSM). An OFDMA network may implement a radio technology such as Evolved UTRA (E-UTRA), Ultra Mobile Broadband (UMB), IEEE 802.11 (Wi-Fi), IEEE 802.16 (WiMAX), IEEE 802.20, Flash-OFDM®, etc. UTRA and E-UTRA are part of Universal Mobile Telecommunication System (UMTS). 3GPP Long Term Evolution (LTE) and LTE-Advanced (LTE-A), in both frequency division duplex (FDD) and time division duplex (TDD), are new releases of UMTS that use E-UTRA, which employs OFDMA on the downlink and SC-FDMA on the uplink. UTRA, E-UTRA, UMTS, LTE, LTE-A and GSM are described in documents from an organization named "3rd Generation Partnership Project" (3GPP). cdma2000 and UMB are described in documents from an organization named "3rd Generation Partnership Project 2" (3GPP2). The techniques described herein may be used for the wireless networks and radio technologies mentioned above as well as other wireless networks and radio technologies. For clarity, certain aspects of the techniques are described below for LTE/LTE-A, and LTE/LTE-A terminology is used in much of the description below. LTE and LTE-A are referred to generally as LTE.

An Example Wireless Communications System

Figure 1:
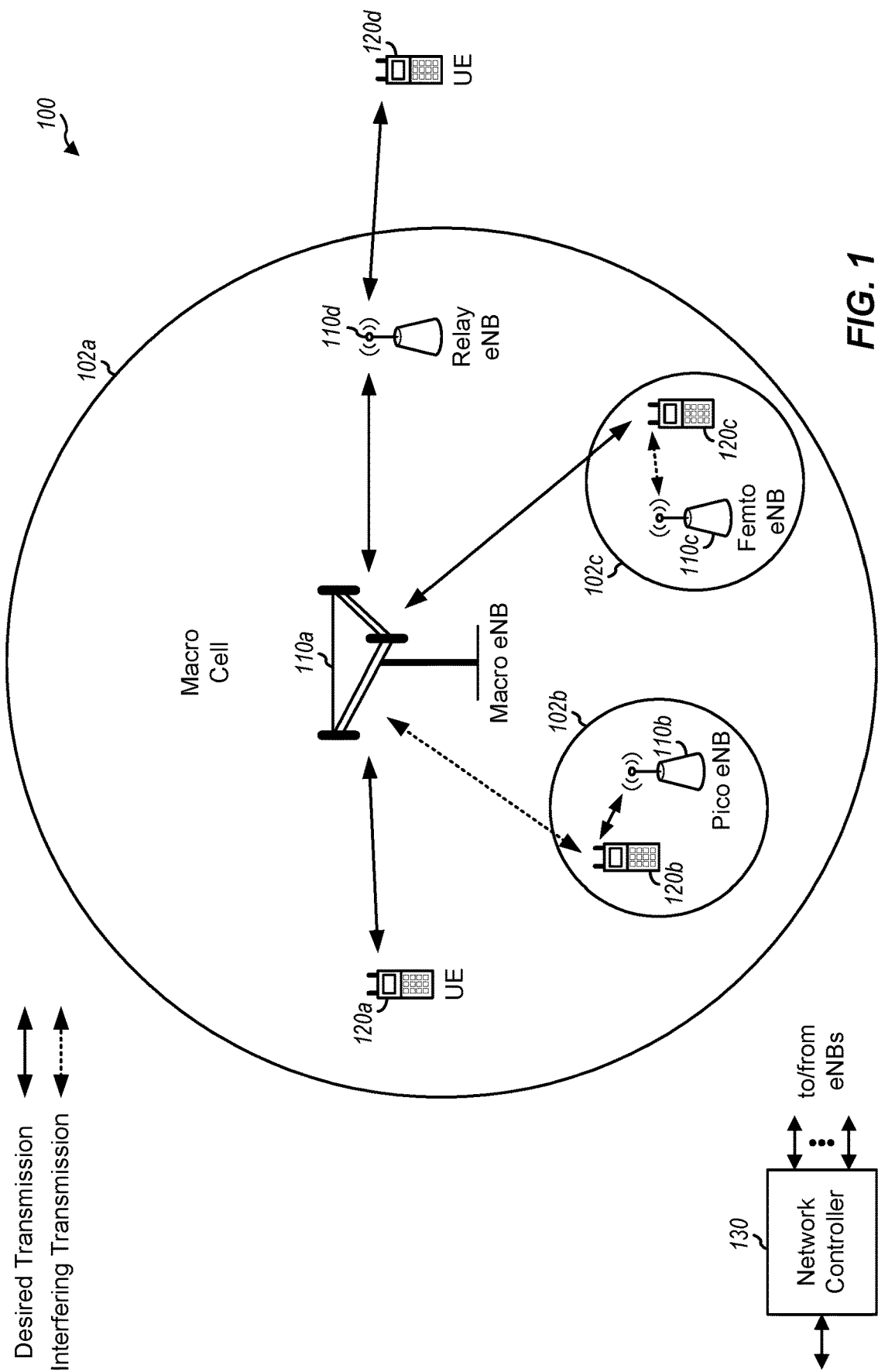
FIG. 1 is a block diagram conceptually illustrating an example wireless communication network, in accordance with certain aspects of the present disclosure.

FIG. 1 illustrates an example wireless communication network 100 with base stations (BSs) and user equipments (UEs), in which aspects of the present disclosure may be practiced.

For example, UEs and BS may operate in a network 100 using a frame structure which supports multi-user uplink multiplexing, for example, in at least one narrowband region of a wider system bandwidth.

The wireless communication network 100 may be an LTE network or some other wireless network. Wireless communication network 100 may include a number of evolved Node Bs (eNBs) 110 and other network entities. An eNB is an entity that communicates with user equipments (UEs) and may also be referred to as a base station, a Node B, an access point (AP), etc. Each eNB may provide communication coverage for a particular geographic area. In 3GPP, the term "cell" can refer to a coverage area of an eNB and/or an eNB subsystem serving this coverage area, depending on the context in which the term is used.

An eNB may provide communication coverage for a macro cell, a pico cell, a femto cell, and/or other types of cell. A macro cell may cover a relatively large geographic area (e.g., several kilometers in radius) and may allow unrestricted access by UEs with service subscription. A pico cell may cover a relatively small geographic area and may allow unrestricted access by UEs with service subscription. A femto cell may cover a relatively small geographic area (e.g., a home) and may allow restricted access by UEs having association with the femto cell (e.g., UEs in a closed subscriber group (CSG)). An eNB for a macro cell may be referred to as a macro eNB. An eNB for a pico cell may be referred to as a pico eNB. An eNB for a femto cell may be referred to as a femto eNB or a home eNB (HeNB). In the example shown in FIG. 1, an eNB 110a may be a macro eNB for a macro cell 102a, an eNB 110b may be a pico eNB for a pico cell 102b, and an eNB 110c may be a femto eNB for a femto cell 102c. An eNB may support one or multiple (e.g., three) cells. The terms "eNB", "base station," and "cell" may be used interchangeably herein.

Wireless communication network 100 may also include relay stations. A relay station is an entity that can receive a transmission of data from an upstream station (e.g., an eNB or a UE) and send a transmission of the data to a downstream station (e.g., a UE or an eNB). A relay station may also be a UE that can relay transmissions for other UEs. In the example shown in FIG. 1, a relay (station) eNB 110d may communicate with macro eNB 110a and a UE 120d in order to facilitate communication between eNB 110a and UE 120d. A relay station may also be referred to as a relay eNB, a relay base station, a relay, etc.

Wireless communication network 100 may be a heterogeneous network that includes eNBs of different types, e.g., macro eNBs, pico eNBs, femto eNBs, relay eNBs, etc. These different types of eNBs may have different transmit power levels, different coverage areas, and different impact on interference in wireless communication network 100. For example, macro eNBs may have a high transmit power level (e.g., 5 to 40 W) whereas pico eNBs, femto eNBs, and relay eNBs may have lower transmit power levels (e.g., 0.1 to 2 W).

A network controller 130 may couple to a set of eNBs and may provide coordination and control for these eNBs. Network controller 130 may communicate with the eNBs via a backhaul. The eNBs may also communicate with one another, e.g., directly or indirectly via a wireless or wireline backhaul.

UEs 120 (e.g., 120a, 120b, 120c) may be dispersed throughout wireless communication network 100, and each UE may be stationary or mobile. A UE may also be referred to as an access terminal, a terminal, a mobile station (MS), a subscriber unit, a station (STA), etc. A UE may be a cellular phone, a personal digital assistant (PDA), a wireless modem, a wireless communication device, a handheld device, a laptop computer, a cordless phone, a wireless local loop (WLL) station, a tablet, a smart phone, a netbook, a smartbook, an ultrabook, etc.

One or more UEs 120 in the wireless communication network 100 (e.g., an LTE network) may also be low cost (LC), low data rate devices, e.g., such as MTC UEs, eMTC UEs, etc. The UEs may co-exist with legacy and/or advanced UEs in the LTE network and may have one or more capabilities that are limited when compared to the other UEs (e.g., non-LC UEs) in the wireless network. For example, when compared to legacy and/or advanced UEs in the LTE network, the LC UEs may operate with one or more of the following: a reduction in maximum bandwidth (relative to legacy UEs), a single receive radio frequency (RF) chain, reduction of peak rate, reduction of transmit power, rank 1 transmission, half duplex operation, etc. Devices with limited communication resources, such as MTC devices, eMTC devices, etc. may be referred to generally as LC UEs. Similarly, legacy devices, such as legacy and/or advanced UEs (e.g., in LTE) may be referred to generally as non-LC UEs.

Figure 2:
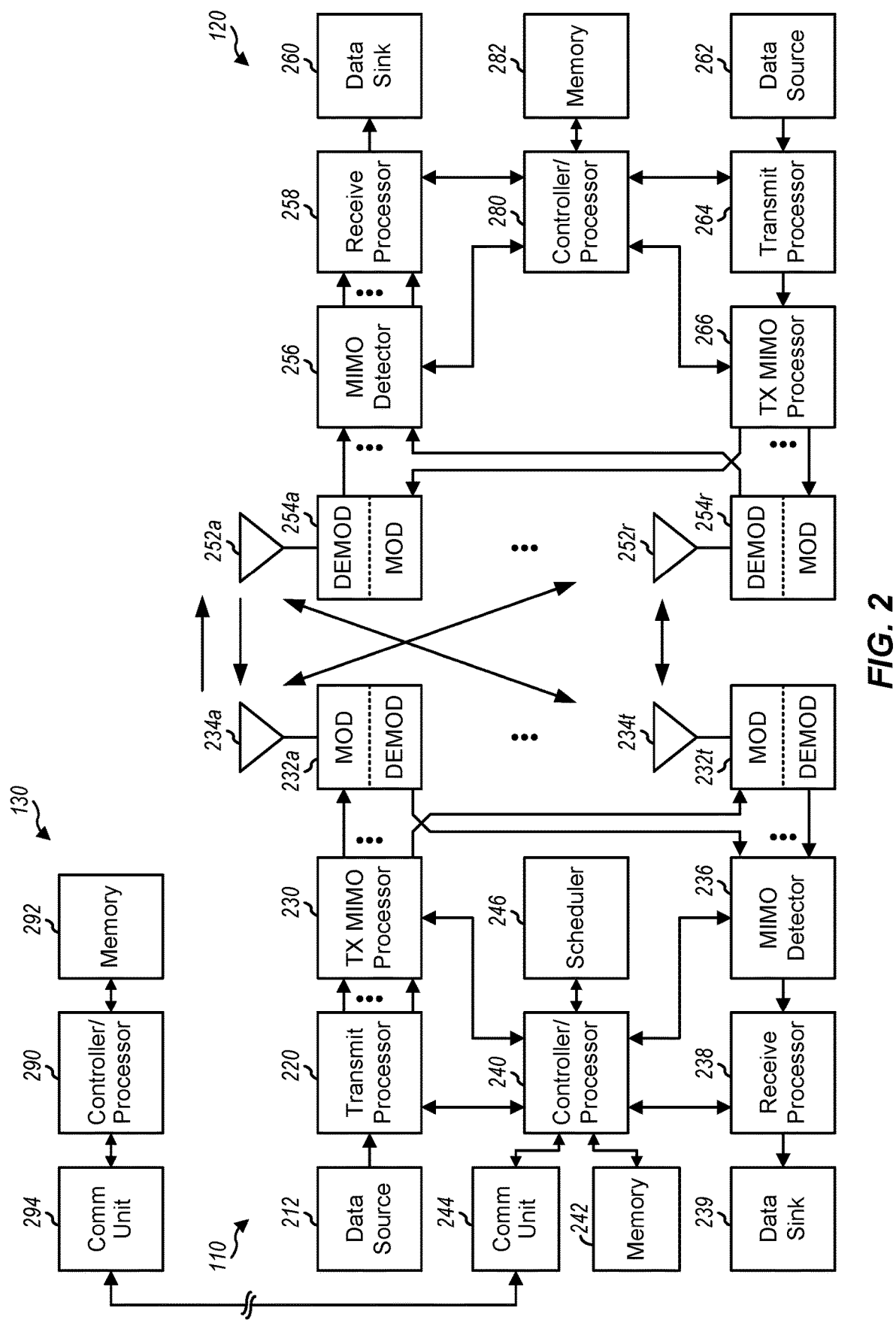
FIG. 2 is a block diagram conceptually illustrating an example of an evolved NodeB (eNB) in communication with a user equipment (UE) in a wireless communications network, in accordance with certain aspects of the present disclosure.

FIG. 2 is a block diagram of a design of BS/eNB 110 and UE 120, which may be one of the BSs/eNBs 110 and one of the UEs 120, respectively, in FIG. 1.

At BS 110, a transmit processor 220 may receive data from a data source 212 for one or more UEs, select one or more modulation and coding schemes (MCSs) for each UE based on channel quality indicators (CQIs) received from the UE, process (e.g., encode and modulate) the data for each UE based on the MCS(s) selected for the UE, and provide data symbols for all UEs. Transmit processor 220 may also process system information (e.g., for semi-static resource partitioning information (SRPI), etc.) and control information (e.g., CQI requests, grants, upper layer signaling, etc.) and provide overhead symbols and control symbols. Processor 220 may also generate reference symbols for reference signals (e.g., the common reference signal (CRS)) and synchronization signals (e.g., the primary synchronization signal (PSS) and secondary synchronization signal (SSS)). A transmit (TX) multiple-input multiple-output (MIMO) processor 230 may perform spatial processing (e.g., precoding) on the data symbols, the control symbols, the overhead symbols, and/or the reference symbols, if applicable, and may provide T output symbol streams to T modulators (MODs) 232a through 232t. Each MOD 232 may process a respective output symbol stream (e.g., for OFDM, etc.) to obtain an output sample stream. Each MOD 232 may further process (e.g., convert to analog, amplify, filter, and upconvert) the output sample stream to obtain a downlink signal. T downlink signals from modulators 232a through 232t may be transmitted via T antennas 234a through 234t, respectively.

At UE 120, antennas 252a through 252r may receive the downlink signals from BS 110 and/or other BSs and may provide received signals to demodulators (DEMODs) 254a through 254r, respectively. Each DEMOD 254 may condition (e.g., filter, amplify, downconvert, and digitize) its received signal to obtain input samples. Each DEMOD 254 may further process the input samples (e.g., for OFDM, etc.) to obtain received symbols. A MIMO detector 256 may obtain received symbols from all R demodulators 254a through 254r, perform MIMO detection on the received symbols if applicable, and provide detected symbols. A receive processor 258 may process (e.g., demodulate and decode) the detected symbols, provide decoded data for UE 120 to a data sink 260, and provide decoded control information and system information to a controller/processor 280. A channel processor may determine reference signal received power (RSRP), received signal strength indicator (RSSI), reference signal received quality (RSRQ), CQI, etc.

On the uplink, at UE 120, a transmit processor 264 may receive and process data from a data source 262 and control information (e.g., for reports comprising RSRP, RSSI, RSRQ, CQI, etc.) from controller/processor 280. Processor 264 may also generate reference symbols for one or more reference signals. The symbols from transmit processor 264 may be precoded by a TX MIMO processor 266 if applicable, further processed by MODs 254a through 254r (e.g., for SC-FDM, OFDM, etc.), and transmitted to BS 110. At BS 110, the uplink signals from UE 120 and other UEs may be received by antennas 234, processed by DEMODs 232, detected by a MIMO detector 236 if applicable, and further processed by a receive processor 238 to obtain decoded data and control information sent by UE 120. Processor 238 may provide the decoded data to a data sink 239 and the decoded control information to controller/processor 240. BS 110 may include communication unit 244 and communicate to network controller 130 via communication unit 244. Network controller 130 may include communication unit 294, controller/processor 290, and memory 292.

Controllers/processors 240 and 280 may direct the operation at BS 110 and UE 120, respectively. For example, controller/processor 240 and/or other processors and modules at BS 110 may perform or direct operations 700 and/or other processes for the techniques described herein. Similarly, controller/processor 280 and/or other processors and modules at UE 120 may perform or direct operations 600 and/or processes for the techniques described herein. Memories 242 and 282 may store data and program codes for BS 110 and UE 120, respectively.

Figure 3:
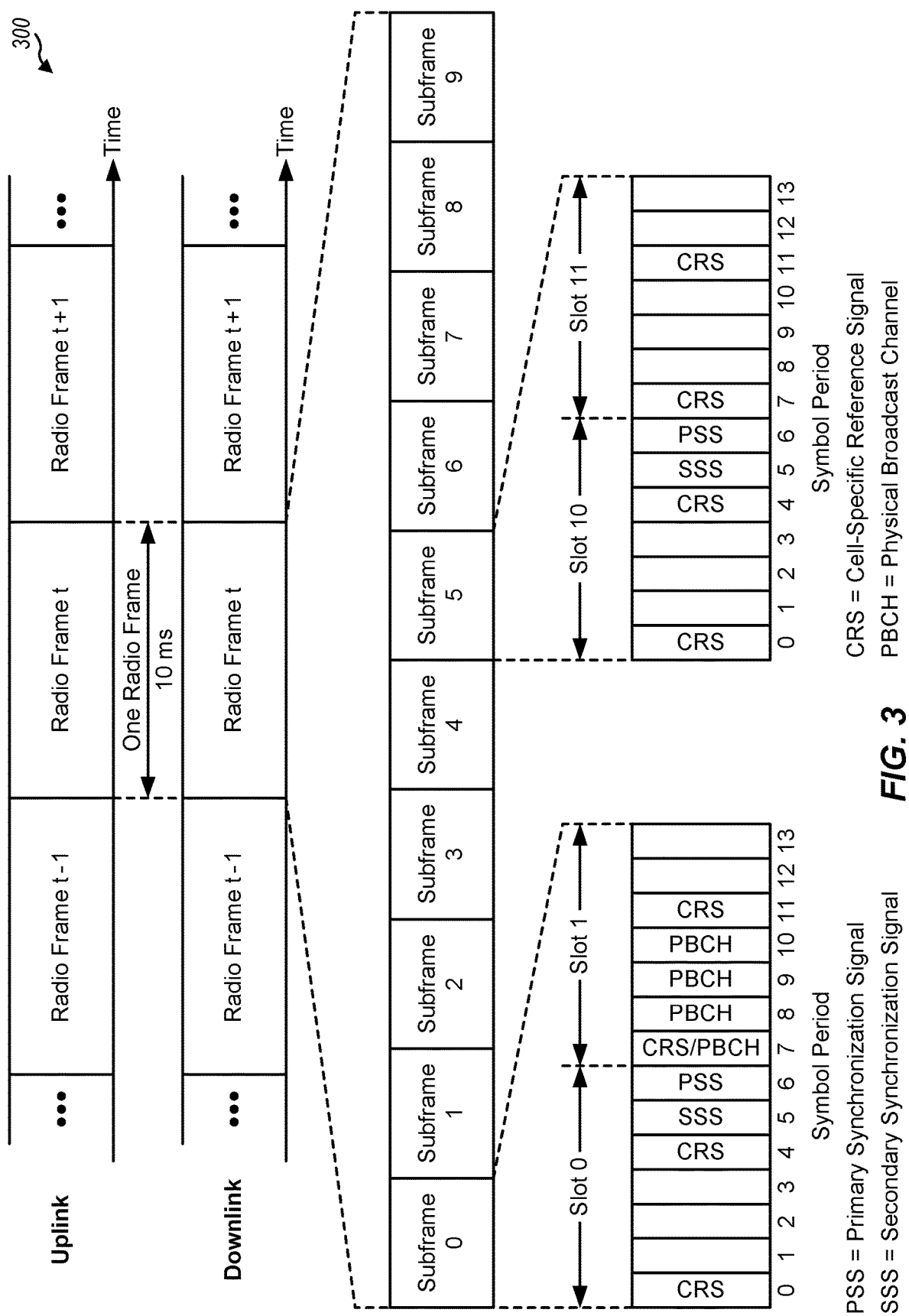
FIG. 3 is a block diagram conceptually illustrating an example frame structure for a particular radio access technology (RAT) for use in a wireless communications network, in accordance with certain aspects of the present disclosure.

FIG. 3 shows an exemplary frame structure 300 for FDD in LTE. The transmission timeline for each of the downlink and uplink may be partitioned into units of radio frames. Each radio frame may have a predetermined duration (e.g., 10 milliseconds (ms)) and may be partitioned into 10 subframes with indices of 0 through 9. Each subframe may include two slots. Each radio frame may thus include 20 slots with indices of 0 through 19. Each slot may include L symbol periods, e.g., seven symbol periods for a normal cyclic prefix (as shown in FIG. 2) or six symbol periods for an extended cyclic prefix. The 2L symbol periods in each subframe may be assigned indices of 0 through 2L-1.

In LTE, an eNB may transmit a primary synchronization signal (PSS) and a secondary synchronization signal (SSS) on the downlink in the center 1.08 MHz of the system bandwidth for each cell supported by the eNB. The PSS and SSS may be transmitted in symbol periods 6 and 5, respectively, in subframes 0 and 5 of each radio frame with the normal cyclic prefix, as shown in FIG. 3. The PSS and SSS may be used by UEs for cell search and acquisition. The eNB may transmit a cell-specific reference signal (CRS) across the system bandwidth for each cell supported by the eNB. The CRS may be transmitted in certain symbol periods of each subframe and may be used by the UEs to perform channel estimation, channel quality measurement, and/or other functions. The eNB may also transmit a physical broadcast channel (PBCH) in symbol periods 0 to 3 in slot 1 of certain radio frames. The PBCH may carry some system information. The eNB may transmit other system information such as system information blocks (SIBs) on a physical downlink shared channel (PDSCH) in certain subframes. The eNB may transmit control information/data on a physical downlink control channel (PDCCH) in the first B symbol periods of a subframe, where B may be configurable for each subframe. The eNB may transmit traffic data and/or other data on the PDSCH in the remaining symbol periods of each subframe.

The PSS, SSS, CRS, and PBCH in LTE are described in 3GPP TS 36.211, entitled "Evolved Universal Terrestrial Radio Access (E-UTRA); Physical Channels and Modulation," which is publicly available.

Figure 4:
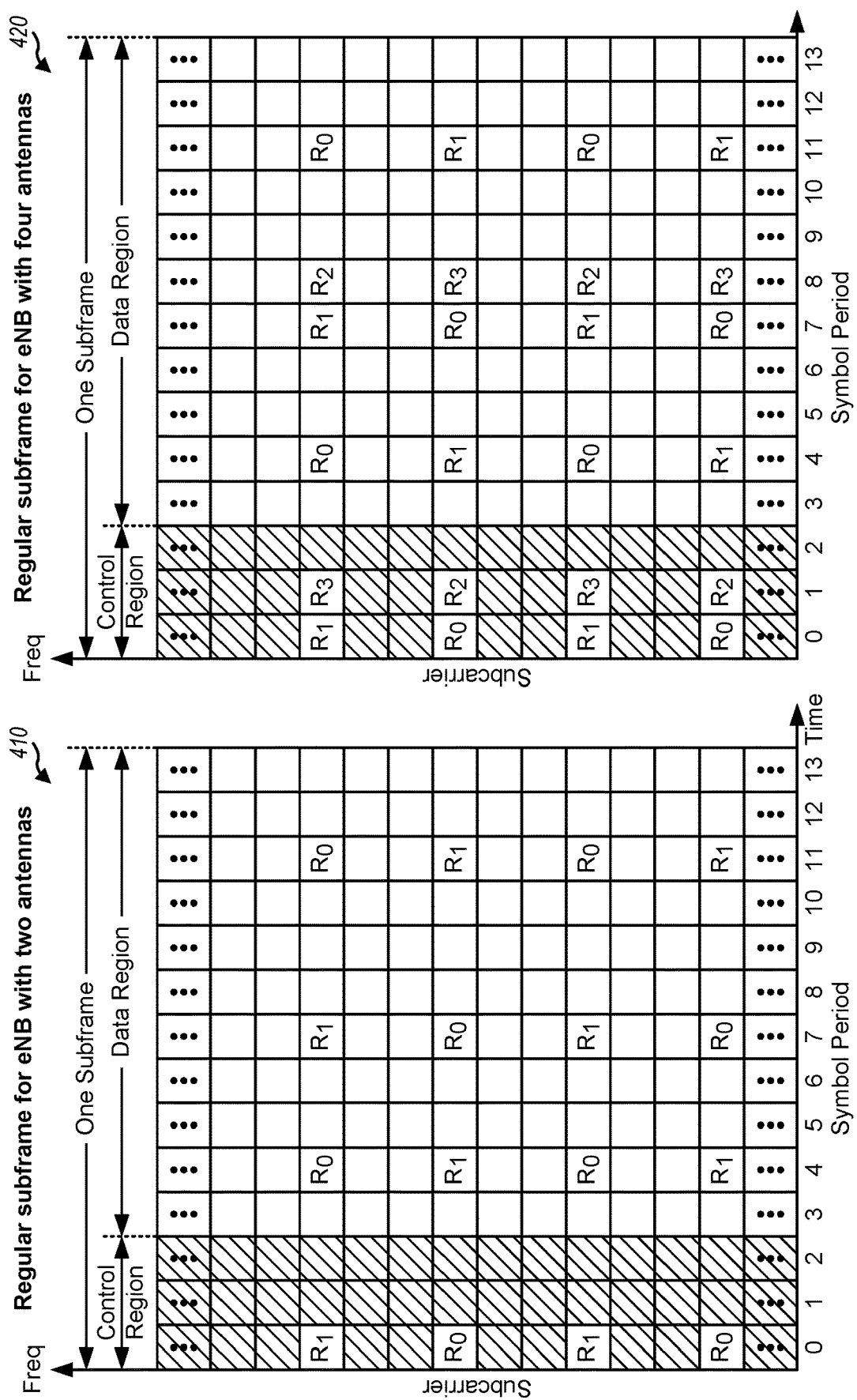
FIG. 4 illustrates example subframe formats for the downlink with a normal cyclic prefix, in accordance with certain aspects of the present disclosure.

FIG. 4 shows two example subframe formats 410 and 420 for the downlink with a normal cyclic prefix. The available time frequency resources for the downlink may be partitioned into resource blocks (RBs). Each RB may cover 12 subcarriers in one slot and may include a number of resource elements. Each resource element may cover one subcarrier in one symbol period and may be used to send one modulation symbol, which may be a real or complex value.

Subframe format 410 may be used for an eNB equipped with two antennas. A CRS may be transmitted from antennas 0 and 1 in symbol periods 0, 4, 7, and 11. A reference signal is a signal that is known a priori by a transmitter and a receiver and may also be referred to as pilot. A CRS is a reference signal that is specific for a cell, e.g., generated based on a cell identity (ID). In FIG. 4, for a given resource element with label Ra, a modulation symbol may be transmitted on that resource element from antenna a, and no modulation symbols may be transmitted on that resource element from other antennas. Subframe format 420 may be used for an eNB equipped with four antennas. A CRS may be transmitted from antennas 0 and 1 in symbol periods 0, 4, 7, and 11 and from antennas 2 and 3 in symbol periods 1 and 8. For both subframe formats 410 and 420, a CRS may be transmitted on evenly spaced subcarriers, which may be determined based on cell ID. Different eNBs may transmit their CRSs on the same or different subcarriers, depending on their cell IDs. For both subframe formats 410 and 420, resource elements not used for the CRS may be used to transmit data (e.g., traffic data, control data, and/or other data).

An interlace structure may be used for each of the downlink and uplink for FDD in LTE. For example, Q interlaces with indices of 0 through Q−1 may be defined, where Q may be equal to 4, 6, 8, 10, or some other value. Each interlace may include subframes that are spaced apart by Q frames. In particular, interlace q may include subframes q, q+Q, q+2Q, etc., where q $\in \{0, \ldots, Q-1\}$.

The wireless network may support hybrid automatic retransmission request (HARQ) for data transmission on the downlink and uplink. For HARQ, a transmitter (e.g., an eNB 110) may send one or more transmissions of a packet until the packet is decoded correctly by a receiver (e.g., a UE 120) or some other termination condition is encountered. For synchronous HARQ, all transmissions of the packet may be sent in subframes of a single interlace. For asynchronous HARQ, each transmission of the packet may be sent in any subframe.

A UE may be located within the coverage of multiple eNBs. One of these eNBs may be selected to serve the UE. The serving eNB may be selected based on various criteria such as received signal strength, received signal quality, path loss, etc. Received signal quality may be quantified by a signal-to-interference-plus-noise ratio (SINR), or a reference signal received quality (RSRQ), or some other metric. The UE may operate in a dominant interference scenario in which the UE may observe high interference from one or more interfering eNBs.

The focus of traditional LTE design (e.g., for legacy "non MTC" devices) is on the improvement of spectral efficiency, ubiquitous coverage, and enhanced quality of service (QoS) support. Current LTE system downlink (DL) and uplink (UL) link budgets are designed for coverage of high end devices, such as state-of-the-art smartphones and tablets, which may support a relatively large DL and UL link budget. However, low cost, low rate devices need to be supported as well.

Thus, as described above, one or more UEs in the wireless communication network (e.g., wireless communication network 100) may be devices that have limited communication resources, such as LC UEs, as compared to other (non-LC) devices in the wireless communication network.

In some systems, for example, in LTE Rel-13, the LC UE (e.g., MTC, eMTC UE) may be limited to a particular narrowband assignment within an available system bandwidth. However, the LC UE may be able to retune to different narrowband regions within the available system bandwidth of the LTE system, for example, in order to co-exist within the LTE system.

As another example of coexistence within the LTE system, LC UEs may be able to receive (with repetition) legacy physical broadcast channel (PBCH) (e.g., the LTE physical channel that, in general, carries parameters that may be used for initial access to the cell) and support one or more legacy physical random access channel (PRACH) formats. For example, the LC UE may be able to receive the legacy PBCH with one or more additional repetitions of the PBCH across multiple subframes. As another example, the LC UE may be able to transmit one or more repetitions of PRACH (e.g., with one or more PRACH formats supported) to an eNB in the LTE system. The PRACH may be used to identify the LC UE. Also, the number of repeated PRACH attempts may be configured by the eNB.

The LC UE may also be a link budget limited device and may operate in different modes of operation (e.g. entailing different amounts of repeated messages transmitted to or from the LC UE) based on its link budget limitation. For example, in some cases, the LC UE may operate in a normal coverage mode in which there is little to no repetition (e.g., the amount of repetition needed for the UE to successfully receive and/or transmit a message may be low or repetition may not even be needed). Alternatively, in some cases, the LC UE may operate in a coverage enhancement (CE) mode in which there may be high amounts of repetition. For example, for a 328 bit payload, a LC UE in CE mode may need 150 or more repetitions of the payload in order to successfully receive the payload.

In some cases, e.g., also for LTE Rel-13, the LC UE may have limited capabilities with respect to its reception of broadcast and unicast transmissions. For example, the maximum transport block (TB) size for a broadcast transmission received by the LC UE may be limited to 1000 bits. Additionally, in some cases, the LC UE may not be able to receive more than one unicast TB in a subframe. In some cases (e.g., for both the CE mode and normal mode described above), the LC UE may not be able to receive more than one broadcast TB in a subframe. Further, in some cases, the LC UE may not be able to receive both a unicast TB and a broadcast TB in a subframe.

For MTC, LC UEs that co-exist in the LTE system may also support new messages for certain procedures, such as paging, random access procedure, etc. (e.g., as opposed to conventional messages used in LTE for these procedures). In other words, these new messages for paging, random access procedure, etc. may be separate from the messages used for similar procedures associated with non-LC UEs. For example, as compared to conventional paging messages used in LTE, LC UEs may able to monitor and/or receive paging messages that non-LC UEs may not able to monitor and/or receive. Similarly, as compared to conventional random access response (RAR) messages used in a conventional random access procedure, LC UEs may be able to receive RAR messages that also may not be able to be received by non-LC UEs. The new paging and RAR messages associated with LC UEs may also be repeated one or more times (e.g., "bundled"). In addition, different numbers of repetitions (e.g., different bundling sizes) for the new messages may be supported.

Example Multi-User Multiplexing Frame Structure With Subregions

Aspects of the present disclosure provide a new frame structure for eMTC UEs which may advantageously help support user multiplexing. eMTC UEs often communicate with a limited set of resources, for example, using only a narrowband region of overall system bandwidth. This narrowband region may range in size, for example, from 6 resource blocks (RBs) to a single RB or less. Due to the limited resources, multiplexing multiple UEs may present certain challenges (as there are limited resources to share).

Some systems, for example, in LTE Rel-13, introduce coverage enhancements and support for eMTC, as well as other UEs. As used herein, the term coverage enhancement generally refers to any type of mechanism that extends the coverage range of a device (such as an eMTC device) within a network. One approach for coverage enhancement (CE) is bundling which refers to transmitting the same data multiple times (e.g., across multiple subframes or, as will be described in greater detail below, across multiple symbols within a same subframe).

Certain systems may provide MTC UEs with coverage enhancements of up to 15 dB, which maps to 155.7 dB maximum coupling loss between the UE and an eNB. Accordingly, eMTC UEs and eNBs may perform measurements at low SNRs (e.g., −15 dB to −20 dB). In some systems, coverage enhancements may include channel bundling, wherein messages associated with eMTC UEs may be repeated (e.g., bundled) one or more times (over multiple bundled transmissions). In certain systems, eMTC UEs may support narrowband operation while coexisting with devices that operate in a wider system bandwidth. For example, an eMTC UE may transmit and receive in a narrowband region of the wider system bandwidth. As noted above, the narrowband region may span 6 resource blocks (RBs).

Challenges are also presented when an eMTC uses frequency hopping to switch between different frequency resources. Due to limited radio processing capability, eMTC UEs typically only receive and perform demodulation in one sub-band at a time. Thus, when an allocated sub-band region hops from one band to another, the UE requires retuning time (typically between 1 to 3 LTE symbol durations), which will interrupt both transmission and reception. Aspects of the present disclosure also provide techniques for retuning that help support multiplexing multiple UEs.

Figure 5:
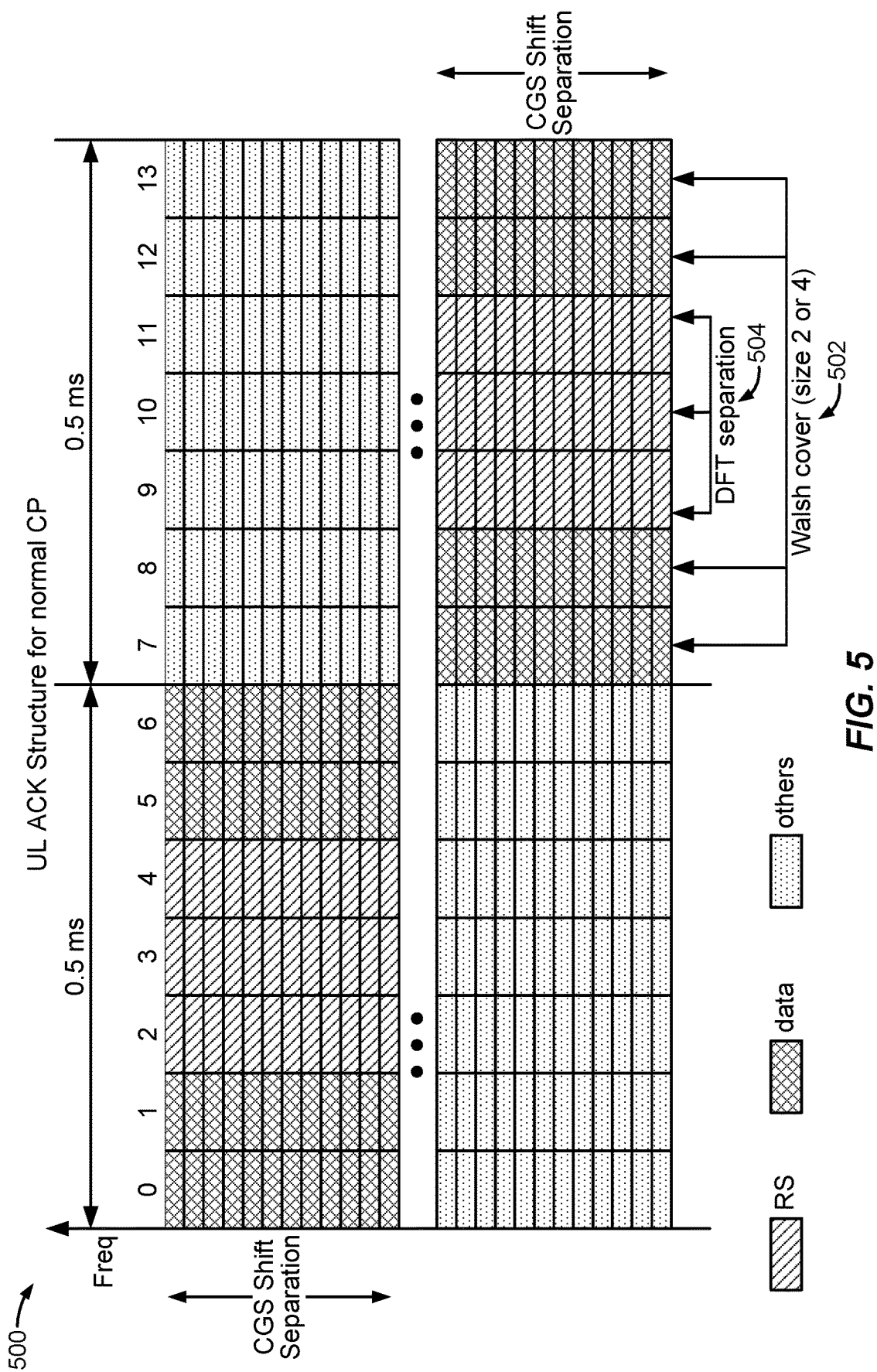
FIG. 5 illustrates an example uplink frame structure, in accordance with certain aspects of the present disclosure.

FIG. 5 illustrates an example frame structure 500 for a physical uplink channel. The illustrated example corresponds to a physical uplink control channel (PUCCH) of a particular format (format 1a/1b). Transmission of PUCCH is typically subject to power control (that limits transmission power) in order to suppress intra-eNB interference caused by simultaneous transmissions by multiple UEs within the same cell.

In some cases for PUCCH transmissions by eMTC UEs, slot based frequency hopping is not allowed within a narrowband. However, cross-subframe frequency hopping, where different frequency resources are selected in different subframes, may be beneficial. As noted above, bundling may also be used to enhance coverage, although bundling may be limited to certain types of transmissions. For example, for periodic or aperiodic CQI, however, bundling may not be supported, for example for large coverage enhancements.

To improve capacity, multiple users may need to be multiplexed in the same limited number of RBs in a narrowband region used for eMTC devices. This may be particularly useful for certain transmissions, such as ACK channels (format 1a and 1b). Such multiplexing may be performed in both the frequency (per symbol) and time (multi-symbol) domain. For example, multiplexing may be performed within a symbol, for example, using different cyclic shifts.

As illustrated in FIG. 5, spreading codes may be used to multiplex transmissions of data symbols from different users sharing the same resources. Different cyclic shifts (e.g., shifts of computer generated Cazac sequences) may be assigned to different users. Further, Walsh codes may be used as block spreading codes with spreading factor (SF) of 2 or 4. As shown in FIG. 5, Walsh covering 502 is used for spreading the data portion. In an aspect, a separate block-spreading operation is used for the reference signal and ACK/NACK data portions in the PUCCH. Further, digital Fourier transform (DFT) separation (e.g., DFT separation 504) may be achieved by assigning different cyclic shifts to users transmitting reference symbols in the same resources.

In some cases, PUCCH transmissions may be bundled for eMTC UEs, meaning the PUCCH transmissions are repeated (e.g., over multiple subframes). The bundling size (referring to the number of repetitions) may depend on coverage enhancement (CE) levels (more repetitions corresponds to greater coverage enhancement). Unfortunately, bundling reduces overall user capacity as the bundling uses time resources for repeating messages.

In some cases, it may be desirable to multiplex eMTC UEs with legacy UEs and/or to multiplex eMTC UEs with different coverage enhancement level. Aspects of the present disclosure provide techniques for allowing such multiplexing in manners that may help avoid constant collision between transmission of the multiplexed UEs. The techniques may also allow for sufficient retuning time to maintain multiplexing orthogonality (such that transmissions from individual UEs are distinguishable at the receiving eNB).

In some instances, cross-subframe frequency hopping between subbands may be supported for an uplink channel for eMTC devices, meaning different frequency resources are used in different subframes. For example, an eMTC device may transmit symbols on the PUCCH in a first frequency in a first subframe and may subsequently hop to a different frequency to transmit symbols on the PUCCH in a second frequency in a second subframe. Additional considerations may include how many times hopping is allowed by an eMTC UE, how long each eMTC UE may remain on a frequency, and/or support of slot-based frequency hopping for PUCCH wherein a device retunes from a first frequency in a first slot of a subframe to a second frequency in a second slot of the subframe to transmit symbols on the PUSCH.

As described above, in certain scenarios, the eMTC UE may operate in a narrowband region that spans only a single resource block (RB). Such a "one RB" eMTC design may present challenges for supporting multiple users. For example, it may be difficult to share the limited frequency resources between multiple users. One proposal to share resources of a one RB region is to use a fractional RB concept, where each UE is assigned a few tones (of the RB), rather than each UE being assigned an entire RB. However, this design diverges from current LTE numerology and may cause a loss in frequency diversity.

Therefore, aspects of the present disclosure provide a new frame structure for eMTC UEs which advantageously supports user multiplexing by allocating different resources (such as different spreading codes or cyclic shifts) for use in their transmissions using the shared resources.

Figure 6:
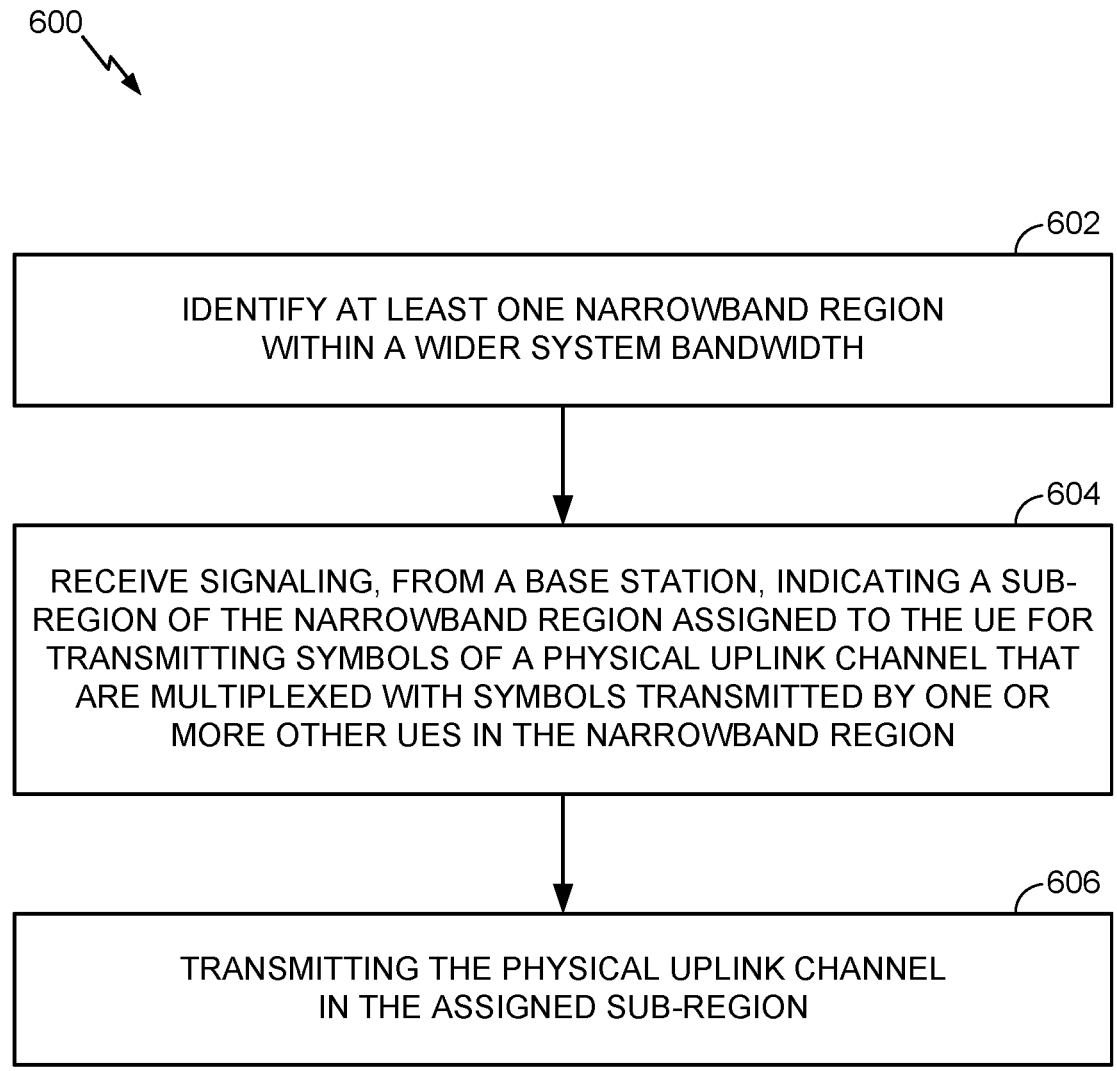
FIG. 6 illustrates an exemplary operation for wireless communications performed by a UE, in accordance with certain aspects of the present disclosure.

FIG. 6 illustrates example operations 600 which may be performed by a UE or by one or more modules of a UE, such as UE 120 in FIG. 2, according to aspects of the present disclosure.

At 602, the UE identifies at least one narrowband region within a wider system bandwidth. As noted above, the narrowband region may be, for example, 1-6 RBs in the frequency dimension.

At 604, the UE receives signaling, from a base station, indicating a sub-region of the narrowband region assigned to the UE for transmitting symbols of a physical uplink channel that are multiplexed with symbols transmitted by one or more other UEs in the narrowband region. As will be described in greater detail below with reference to FIG. 8, the indication may be in the form of an offset into the narrowband region.

At 606, the UE transmits the physical uplink channel in the assigned sub-region.

Figure 7:
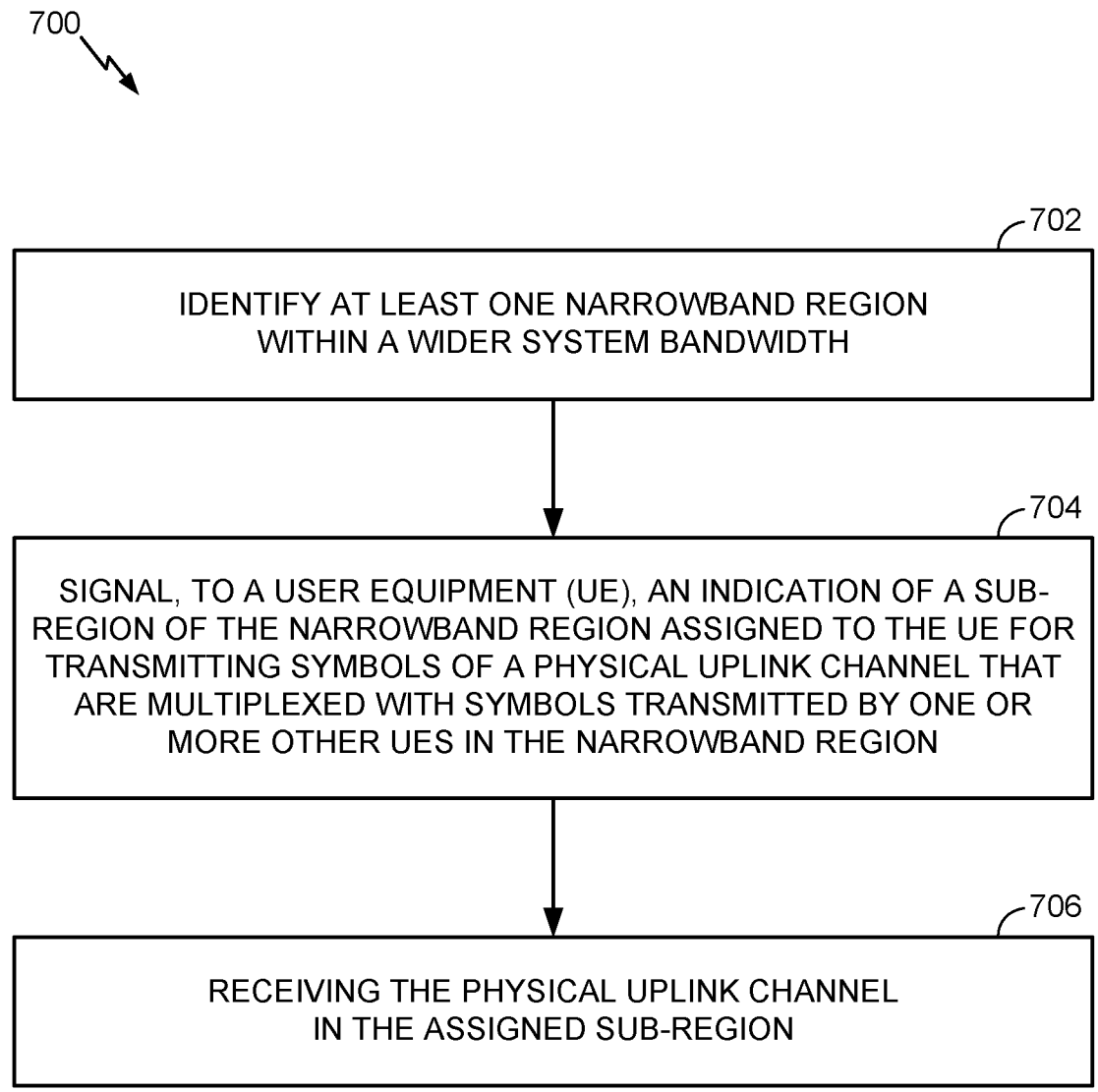
FIG. 7 illustrates an exemplary operation for wireless communications performed by a base station, in accordance with certain aspects of the present disclosure.

FIG. 7 illustrates example operations 700 which may be performed by an eNB or by one or more modules of an eNB, such as eNB 130 in FIG. 2, according to aspects of the present disclosure. In other words, the operations 700 may be performed by an eNB to receive uplink transmissions sent by a UE performing operations 600 described above.

At 702, the eNB identifies at least one narrowband region within a wider system bandwidth, in accordance with certain aspects of the present disclosure. At 704, the eNB signals, to a user equipment (UE), an indication of a sub-region of the narrowband region assigned to the UE for transmitting symbols of a physical uplink channel that are multiplexed with symbols transmitted by one or more other UEs in the narrowband region. At 706, the eNB receives the physical uplink channel in the assigned sub-region.

Figure 8:
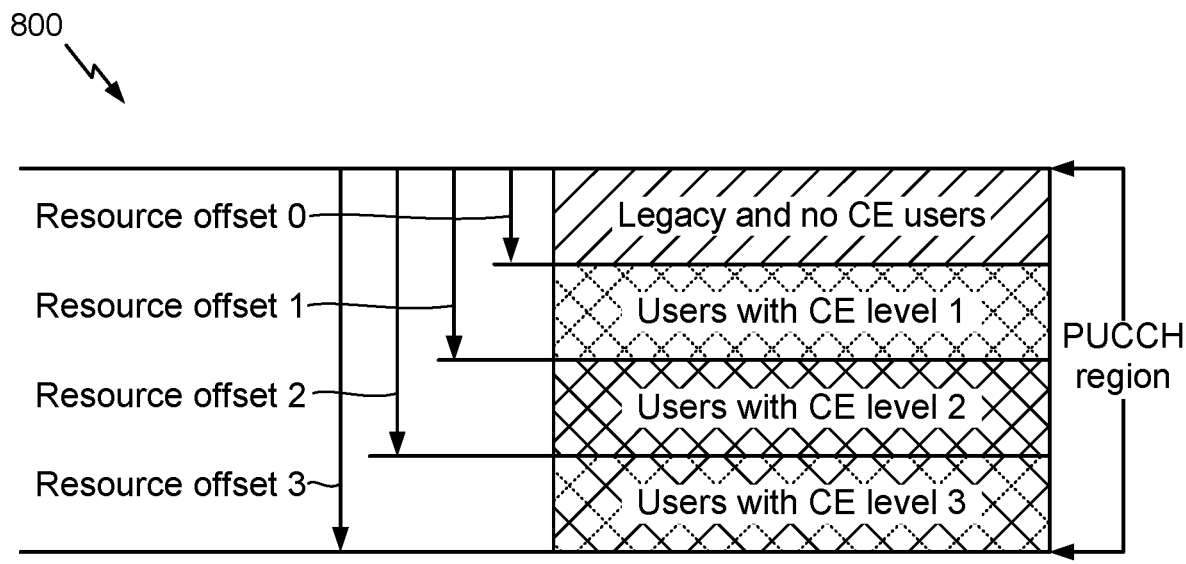
FIG. 8 illustrates an example frame structure with subregions for multi-user multiplexing, according to aspects of the present disclosure.

As noted above, in some cases, the eNB may signal a resource offset into the narrowband region. FIG. 8 illustrates example allocation 800 of different resource offsets into a narrowband region used for PUCCH transmissions, in accordance with certain aspects of the present disclosure. In some cases, different resource offsets may be assigned to different UEs based on their bundling length (with increased bundling length corresponding to different levels of coverage enhancement). For example, as shown in FIG. 8, Resource offset 0 is allocated to legacy and users with no coverage enhancement (CE), Resource offset 1 is allocated to users with CE level 1, Resource offset 2 is allocated to users with CE level 2, and Resource offset 3 is allocated to users with CE level 3.

In some cases, the eNB may assign different cyclic shifts (e.g., different shifted Chu sequences) or spreading codes to the UEs to apply in their respective transmissions. By assigning different cyclic shifts, transmissions from different eMTC UEs using the same frequency resources may be orthogonal. Similarly, by assigning different spreading codes, bundled transmissions from different eMTC UEs sent across multiple symbols or subframes may be orthogonal. In some cases, a combination of spreading codes and cyclic shifts may be used.

According to certain aspects, data symbols from eMTC UEs may be multiplexed using orthogonal covers (spreading codes) over multiple symbols. As described herein, a configurable spreading factor (SF) may be used, with the term spreading factor generally referring to the length of the spreading code (e.g., corresponding to the number of times a value of the spreading code are applied to a repeated transmission, with a "1" of the spreading code corresponding to a non-inverted version of a transmission and a "−1" of the spreading code corresponding to an inverted version of the transmission).

In some cases, an eNB may also signal different Delta (cyclic) shifts for different bundling lengths (e.g., corresponding to different coverage enhancement levels) to further reduce interference. A delta shift generally refers to equally spaced cyclic time shifts and a delta shift parameter is used in calculating a number of resources (per resource block) reserved for DMRS. In this manner, an eNB may make decisions regarding assigning the same or different resource offsets and delta shifts to different UEs, depending on current conditions. For example, if channel conditions are favorable, an eNB may be able to multiplex more UEs using the same frequency resources and may, thus, assign the same resource offset to more UEs. In some cases, legacy UEs may be multiplexed with eMTC UEs that are not configured for coverage enhancement (e.g., are not using bundling).

As noted above, the PUCCH region shown in FIG. 8 may be divided into different sub-regions for legacy UEs and UEs with different coverage enhancement level with each region having a different resource offset. Each sub-region may have a flexible number of RBs and the location of each sub-region may also be flexible.

In some cases, the UE may change or "hop" between different (frequency) resources, for example, on a per-subframe, per-slot, or per-symbol basis. The hopping may be implemented by the UE hopping between different resource indexes that determine what (frequency) resources to use in the narrowband region. In some cases, the UE may determine a current resource index based on a hopping function. The hopping function may be based on an interleaver function.

In some cases, a current slot level resource index hopping may be only a function of slot index (Ns), for example, based on a modulus function (e.g., Ns % 2). In some cases, the UE may apply a spreading code that is repeated every subframe. Different spreading codes may be assigned to different UEs in an effort to maintain orthogonality. The number of different spreading codes that result in orthogonality may depend on the length of the spreading code or "spreading factor."

As noted above, cyclic shifts may be assigned to UEs to apply in their PUCCH transmissions. How the cyclic shifts are assigned may determine how they impact interference. For example, cell-specific cyclic shifts (with each UE in a cell applying the same cyclic shift) at symbol and subframe level would help randomize inter-eNB interference, while interference from UEs in the same cell would still be present every symbol per slot and repeated every subframe.

In some cases, the resource index hopping described above may help address this intra-eNB interference (caused by UEs in the same cell).

In some cases, the UE may receive an indication of a resource index. In such cases, the UE may then map the resource index to a shift index and/or a spreading code index. In some cases, the resource index may vary from slot to slot, as well as subframe to subframe, according to a resource index hopping pattern function. In an aspect, the hopping function depends on an initial resource index (e.g., signaled by the eNB) and, in some cases, may also depend on a subframe index.

Figure 9:
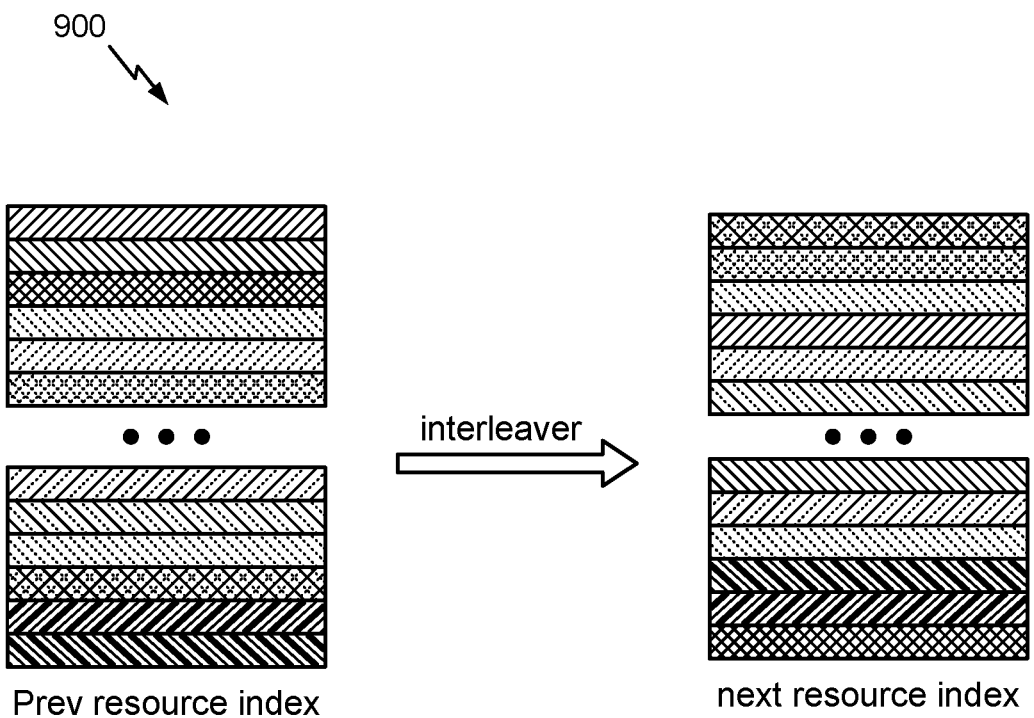
FIG. 9 illustrates an example interleaver operation for frequency resource hopping, in accordance with aspects of the present disclosure.

In some cases, the hopping function may be determined based on an interleaver function. For example, FIG. 9 illustrates an example interleaver function 900 that determines a resource index used for a previous subframe (or symbol or slot) and a subsequent subframe (or symbol or slot), in accordance with certain aspects of the present disclosure. The different hatching patterns in FIG. 9 may correspond to different indices assigned to different UEs.

As noted above, in some cases the UE may map from the resource index to cyclic shifts, which may also vary from symbol to symbol within the slot according to a shift hopping function. As with the interleaver function described above, such a shift hopping function may depend on an initial shift index. The initial shift index, for example, may be signaled by an eNB or determined based on a mapping from an initial resource index signaled by the eNB.

The interleaver of FIG. 9 illustrates how resource index within a same RB may be hopped across subframes. Such hopping may be applied to both ACK and CQI transmissions. As noted above, this may be achieved by applying an interleaver function at each subframe. In some cases, an interleaver index used in a particular symbol may be a function of cell id and, in some cases, also be a function of a subframe index. In some cases, shift and spreading (or-thogonal cover) mapping from a resource index may be reused (as in the same shift and/or spreading code may always be used for a given resource index). In some cases, however, cyclic shifts may change per-symbol, for example, by applying a symbol-level shift index interleaver for remaining symbols of a slot, which may help achieve increased intra-eNB interference suppression.

In general, for intra-eNB interference management, resource index selection may be randomized after each hop. For inter-eNB interference management, frequency hopping pattern may be used to select different frequency resources across different bursts (e.g., bursts across multiple subframes). Thus, frequency hopping in an assigned sub-region corresponding to a UE CE level may be according to a predetermined function that depends on cell id and, in some cases, a burst index.

Figure 10:
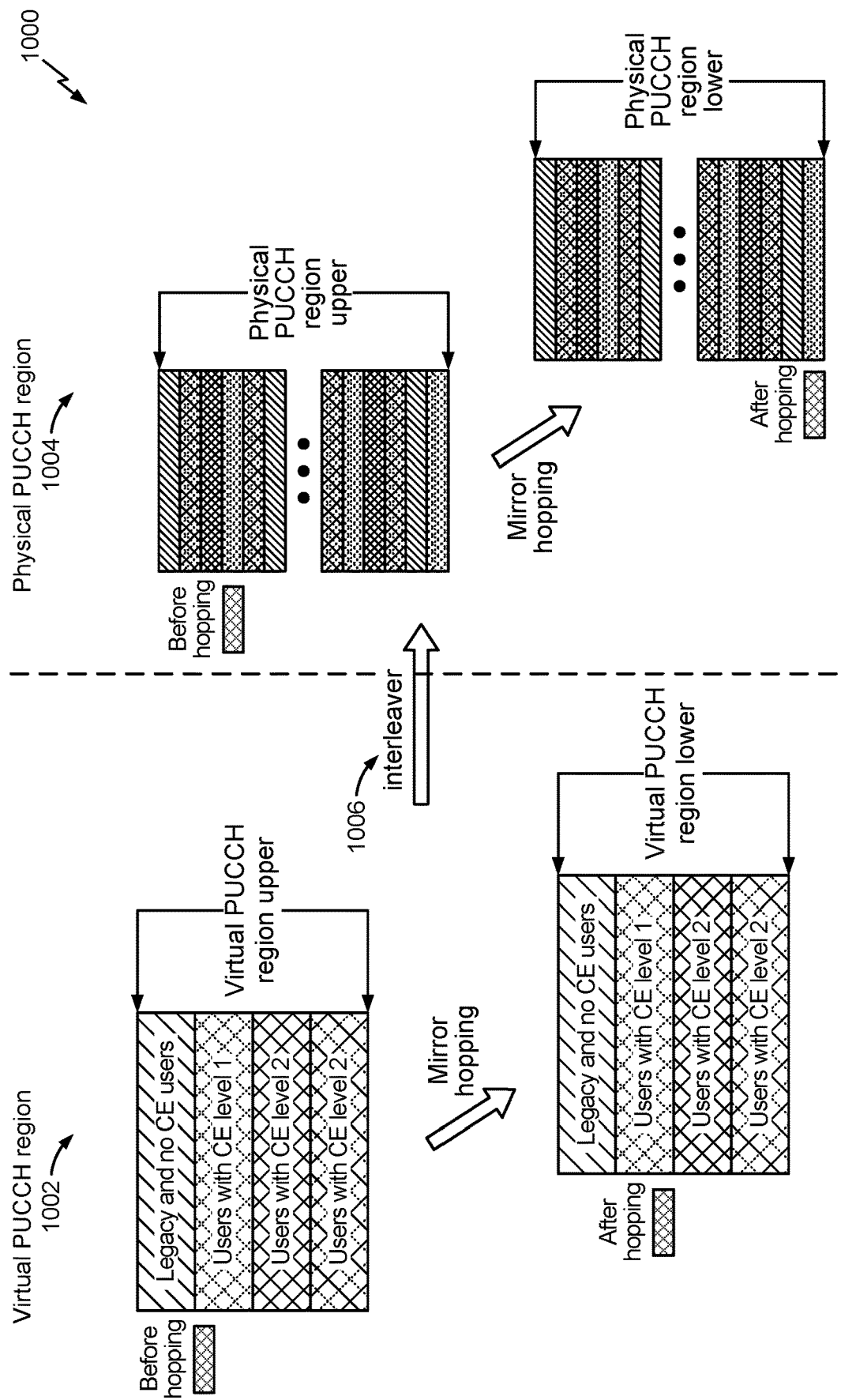
FIG. 10 illustrates example for frequency resource hopping options, in accordance with aspects of the present disclosure.

FIG. 10 illustrates how an interleaver function 1000 may be used to map virtual PUCCH resources to physical resource blocks (PRBs), in accordance with certain aspects of the present disclosure. As illustrated, one option is to utilize mirror hopping in virtual PUCCH region 1002 with interleaved mapping to physical RBs in a physical PUCCH region 1004. As illustrated, frequency hopping may be mirrored within the virtual PUCCH region 1002 (with the same hopping "mirrored" in both upper and lower virtual regions). A random interleaver 1006 may then be used to map the virtual PUCCH region 1002 to PRBs of the physical PUCCH region 1004.

As discussed above, every frequency hopping requires retuning by the UE, which presents a challenge as it causes interruption to transmission and reception. In some cases, care may be taken to try and ensure that time domain orthogonality is maintained for certain transmissions, such as ACK channels and CQI channels. For CQI channels, losing more than 1 symbols (due to retuning) may lead to loss of measurement of one RS symbol in the slot, which may result in a loss of performance.

Figure 11A:
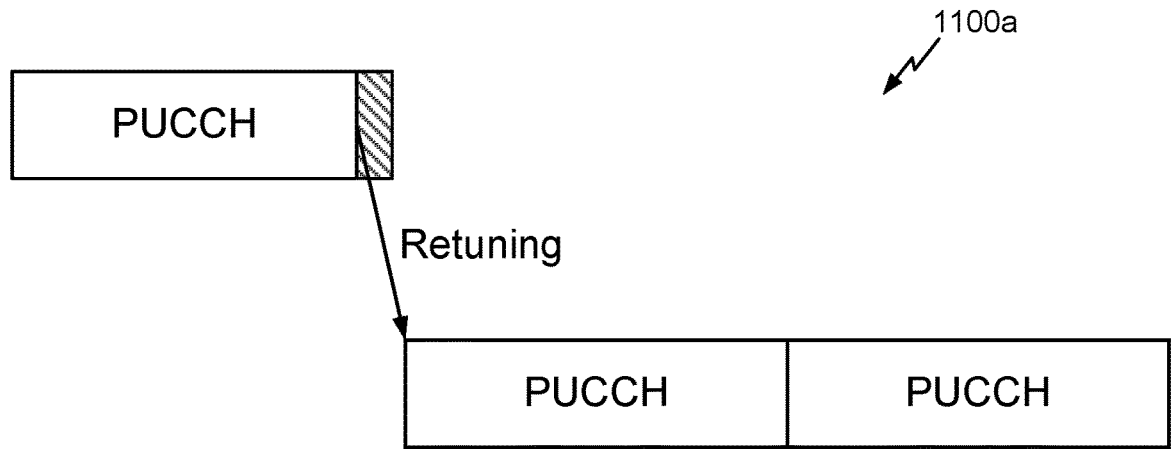
FIGS. 11A-11E illustrate examples for retuning options, in accordance with aspects of the present disclosure.

Aspects of the present disclosure provide different options for managing the re-tuning time. For example, according to one option, a single (one) symbol retuning time may be implemented. FIG. 11A illustrates an example retuning 1100a with a single symbol retuning time, in accordance with certain aspects of the present disclosure. As illustrated in FIG. 11A, this option may result in loss of a last symbol of a previous subframe (e.g., before a frequency hop). In some cases, a virtual SRS may be configured, such that all PUCCH users that occupy the virtual SRS RBs will use a shortened format. In some cases, a minimum SRS granularity (e.g., of 4 RBs) may be configured. In this case, at least 4 RBs of different users may be impacted, but orthogonality may be maintained. This same concept may be applied to PUSCH channel transmissions as well.

Figure 11B:
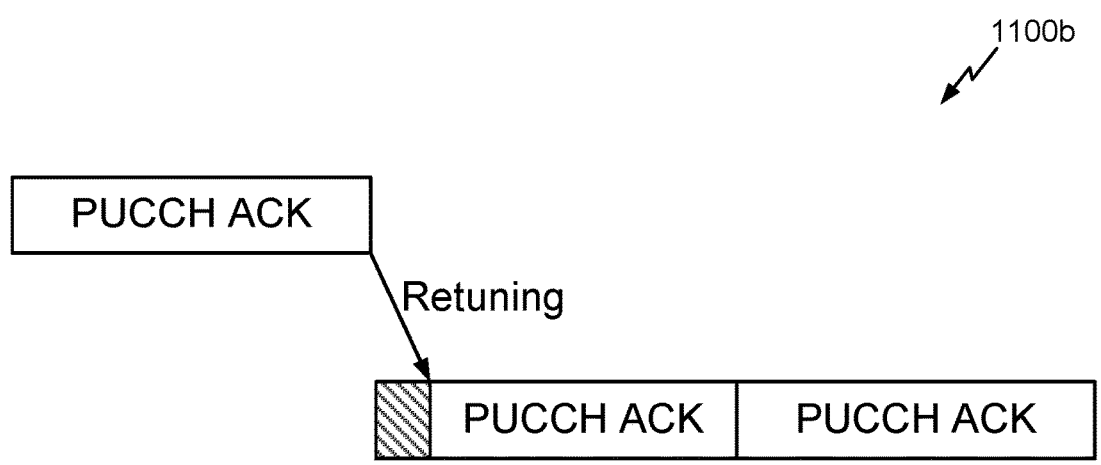

FIG. 11B illustrates an example retuning 1100b with a two-symbol retuning time, in accordance with certain aspects of the present disclosure. In this case, cross-subframe hopping may result in the loss of the first two symbols of a next subframe (e.g., after a frequency hop). In this case, orthogonality may be maintained with spreading factor of 2 (e.g., assigning different Hadamard codes). In some cases, hopped users (performing retuning) may use a Walsh cover code that is not used by other users. For example, a hopped user may use a Walsh cover code of [1 −1 −1 1], if other users use [1 1 1 1] and [1 1 −1 −1]. While the hopped users loose the first 2 data symbols, this approach may result in no interference to other users in the first 2 symbols, while the last 2 data symbols in the slot may still be orthogonal.

Figure 11C:
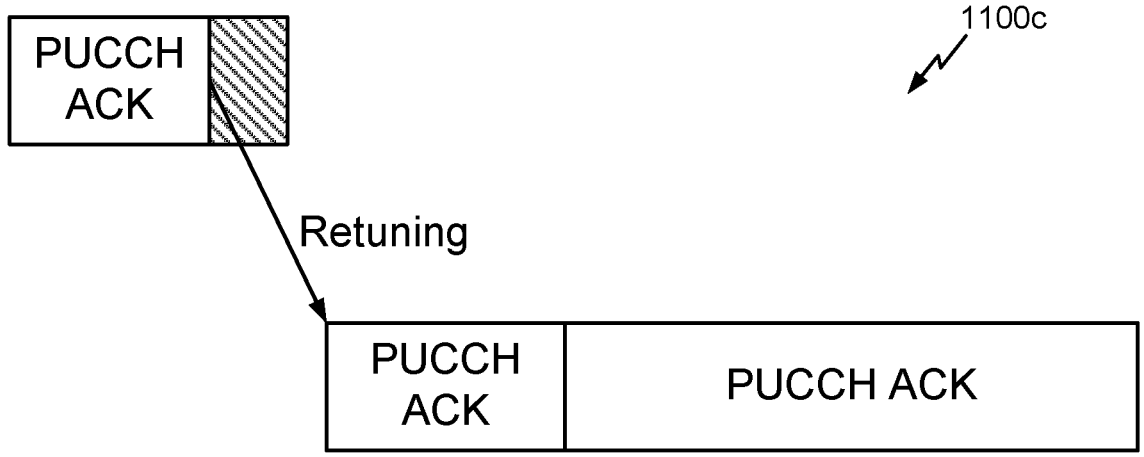

FIG. 11C illustrates an example retuning 1100c, in accordance with certain aspects of the present disclosure. As illustrated in FIG. 11C, in some cases, the last two symbols of a first slot (e.g., before the frequency hop) may be dropped. This approach may be used, for example, in the case of slot-based hopping applied to eMTC UE without coverage enhancement. Dropping the last two symbols of the first slot may allow the UE to still use a shortened PUCCH format.

Figure 11D:
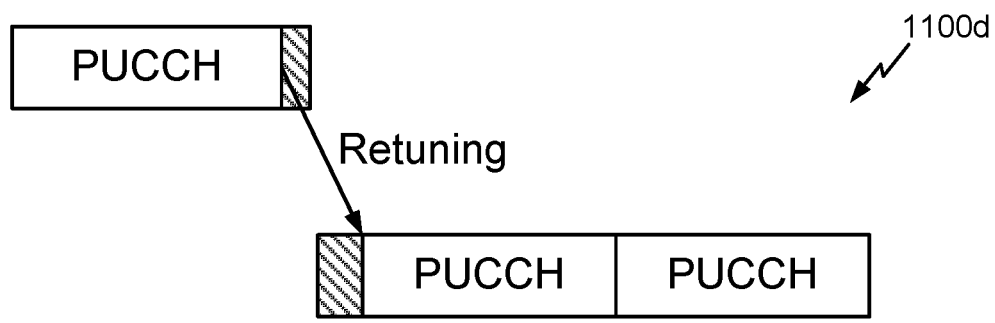

FIG. 11D illustrates an example retuning 1100d, in accordance with certain aspects of the present disclosure. As illustrated in FIG. 11D, in some cases, the last symbol of a previous subframe (e.g., before a frequency hop) and the first two symbols of a next subframe (e.g., after the frequency hop) may be dropped. In this case, the previous subframe may be configured with virtual SRS and all users in the virtual SRS RBs may use a shortened format. In the next subframe, the ACK user behavior may be similar to the two-symbol retuning timing option described above with reference to FIG. 11B. This same concept may also be applied to PUSCH.

Figure 11E:
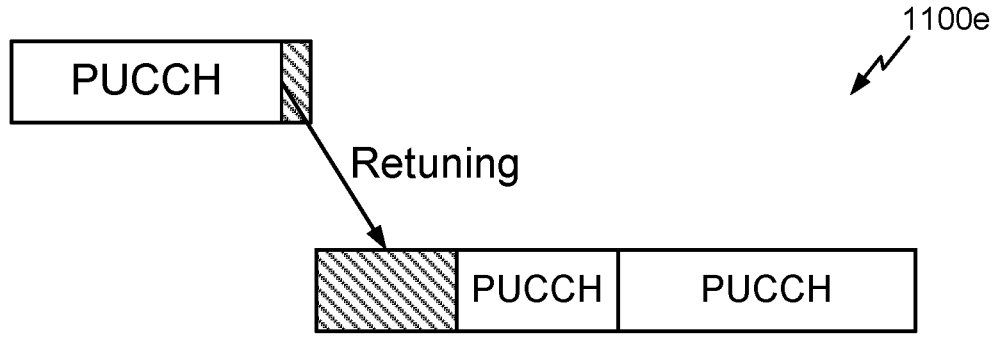

FIG. 11E illustrates an example retuning 1100e, in accordance with certain aspects of the present disclosure. As illustrated in FIG. 11E, in some cases, all symbols of an entire slot may be dropped, for example, after a frequency hop. While there may be a performance loss due to the loss of one slot, in this case, no change to the frame structure is made and all orthogonality may be maintained. This same concept may also be applied to PUSCH.

Figure 12A:
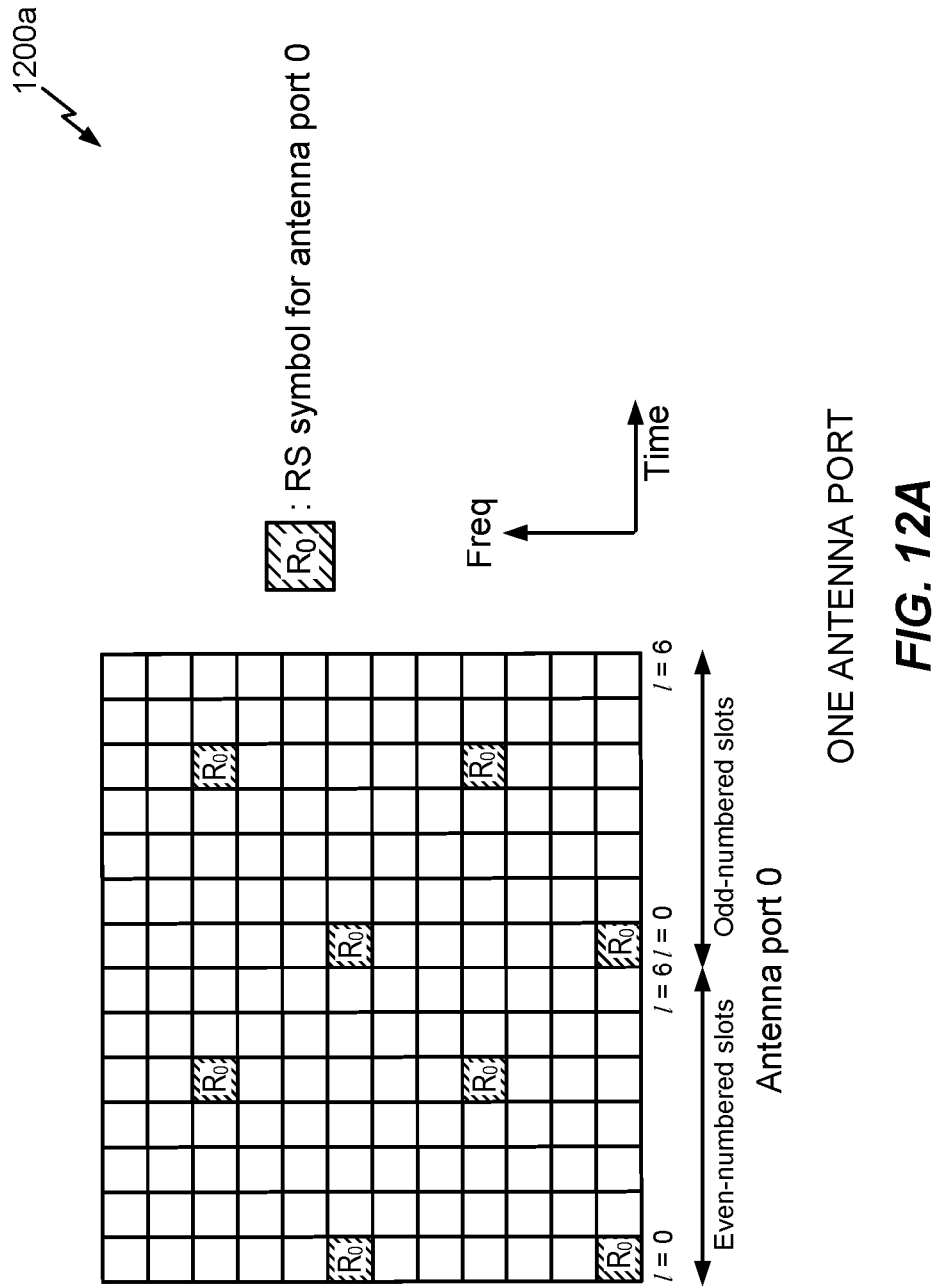
FIGS. 12A-12C illustrate example mappings of cell-specific reference signals, in accordance with aspects of the present disclosure.
Figure 12B:
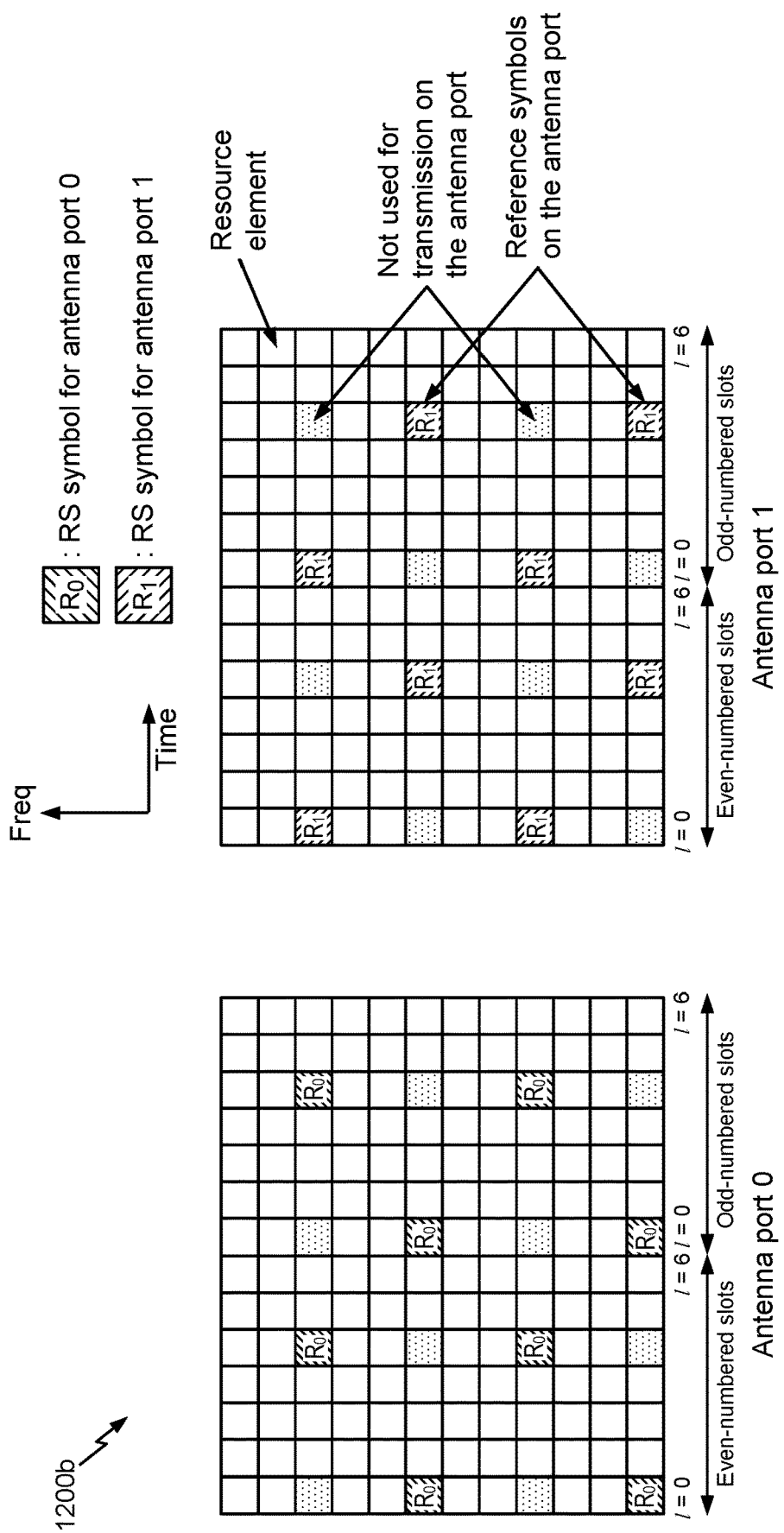
Figure 12C:
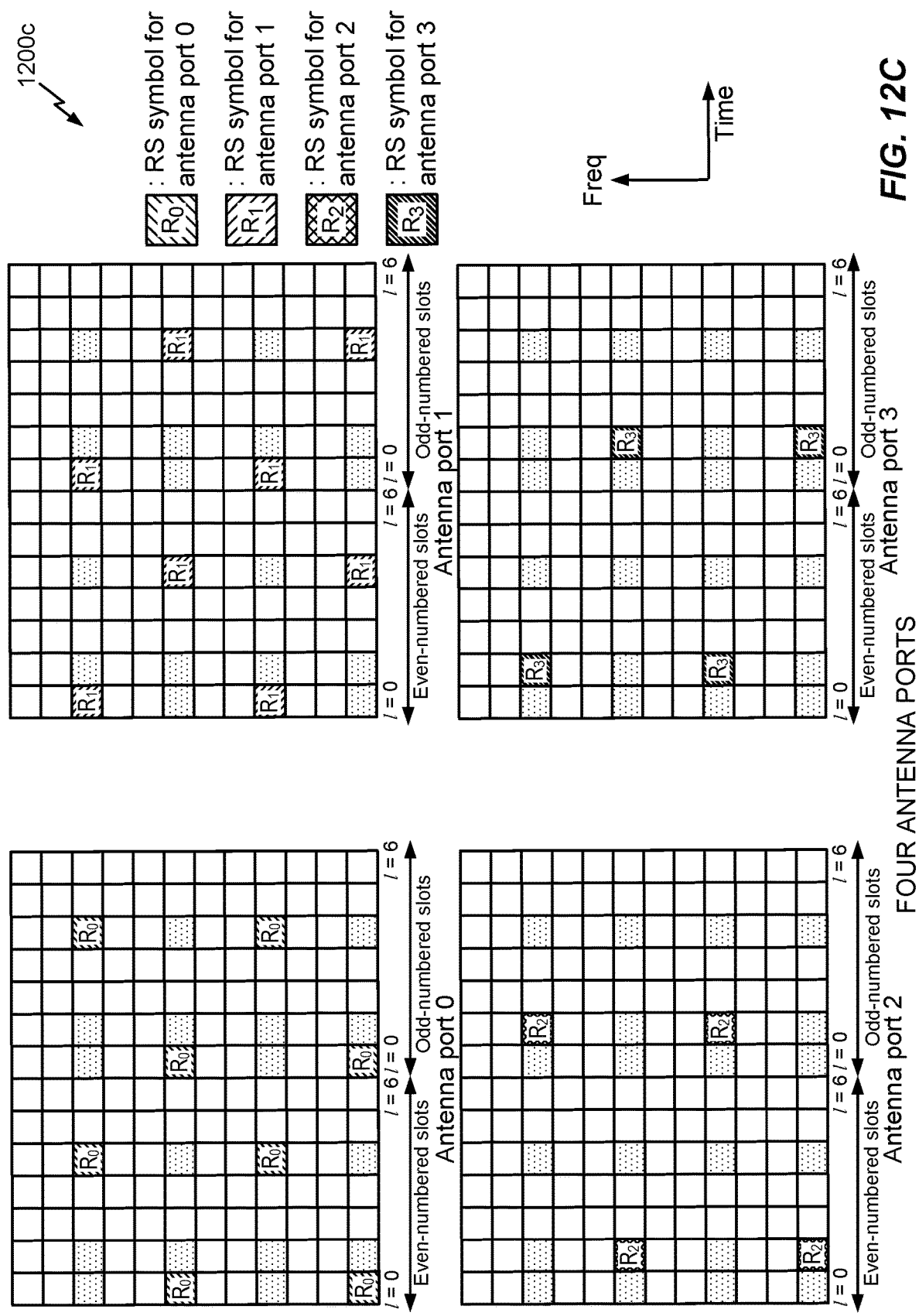

The techniques described above, with reference to uplink transmissions, may be extended to downlink channel transmissions. In some cases, using code division multiplexing (CDM) to support CDM in downlink channel may be challenging due to cell-specific reference signals (CRS) transmitted in tones of certain symbols. For example, FIGS. 12A-12C illustrate example mappings 1200A-1200C respectively of CRS tones in certain symbols of a subframe. FIG. 12A shows one antenna port case, FIG. 12B shows two antenna ports case, and FIG. 12C shows a four antenna port case. As shown in FIGS. 12A-12C, the reference symbols (RS) may include RS symbols for antenna port 0 (represented by R0), RS symbols for antenna port 1 (represented by R1), RS symbols for antenna port 2 (represented by R2), and RS symbols for antenna port 3 (represented by R3). In some cases, to support CDM in downlink channel, symbols may be grouped into sets of symbols that have the same number of data tones and locations. For example, referring to FIGS. 12A-12C, a first set of symbols without CRS may include symbols {2,3,5,6,8,9,10,12,13}, while a second set with CRS may include symbols {14,7,11}, assuming 2 control symbols {0,1} are not included in either set. In some cases, CDM may be used within the same set.

According to certain aspects, the same or different spreading factors may be used. For example, a spreading factor of 3 (SF3) may be used for a first set and SF3 may be used with a second set for total 4 unique data symbols, allowing 3 users multiplexed in the same resource. In some cases, SF2 may be used for the first 6 symbols, while the rest may use SF3 in the first set, and SF3 may be used in second set, providing a total of 5 unique data symbols, which may allow 2 users multiplexed in the same resource. As spreading reduces data rates (repeating the same data multiple times based on the spreading factor), in some cases, no spreading may be used if higher rates are needed.

The set of symbols may include symbols from multiple slots or subframes as well. And further, CDM can also be extended to control channels. With cross subframes spreading factor 1 and, it becomes a special case that control channels span multiple subframes. Spreading for control and data channels are independent of each other.

As used herein, a phrase referring to "at least one of" a list of items refers to any combination of those items, including single members. As an example, "at least one of: a, b, or c" is intended to cover: a, b, c, a-b, a-c, b-c, and a-b-c.

The steps of a method or algorithm described in connection with the disclosure herein may be embodied directly in hardware, in a software/firmware module executed by a processor, or in a combination of the two. A software/firmware module may reside in RAM memory, flash memory, ROM memory, EPROM memory, EEPROM memory, PCM (phase change memory), registers, hard disk, a removable disk, a CD-ROM or any other form of storage medium known in the art. An exemplary storage medium is coupled to the processor such that the processor can read information from, and/or write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal. Generally, where there are operations illustrated in Figures, those operations may have corresponding counterpart means-plus-function components with similar numbering.

In one or more exemplary designs, the functions described may be implemented in hardware, software/firmware or combinations thereof If implemented in software/firmware, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software/firmware is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A method for wireless communications by a user equipment (UE), comprising:
   identifying at least one narrowband region within a wider system bandwidth;
   receiving signaling, from a base station, indicating a sub-region of the narrowband region assigned to the UE for transmitting symbols of a physical uplink channel that are multiplexed with symbols transmitted by one or more other UEs in the narrowband region, wherein the signaling comprises a resource offset into the narrowband region, wherein different resource offsets into the narrowband region define different sub-regions of the narrowband region, and wherein different resource offsets into the narrowband region are assigned to UEs with coverage enhancement and UEs without coverage enhancement;
   receiving a resource index within the sub-region of the narrowband region;
   identifying, based on a mapping of the resource index to cyclic shifts, an initial cyclic shift associated with the resource index for transmitting symbols of the physical uplink channel in the assigned sub-region; and
   transmitting the physical uplink channel in the assigned sub-region based on the resource index, the identified initial cyclic shift, and a shift hopping function.

2. The method of claim 1, wherein the resource index varies from at least one of slot to slot or subframe to subframe, according to a resource index hopping pattern function.

3. The method of claim 2, wherein the resource index hopping function depends, at least in part, on an initial resource index.

4. The method of claim 3, wherein the resource index hopping function also depends on a subframe index.

5. The method of claim 2, wherein the resource index hopping function is based on an interleaver function.

6. The method of claim 1, wherein the mapping of values of the resource index to cyclic shifts varies from symbol to symbol within a slot of a subframe according to the shift hopping function.

7. The method of claim 6, wherein the shift hopping function depends, at least in part, on an initial shift index.

8. The method of claim 1, further comprising:
   determining, based on a mapping of values of the resource index to spreading codes, a spreading code for transmitting symbols of the physical uplink channel in the assigned sub- region; and
   applying the spreading code when transmitting symbols of the physical uplink channel in the assigned sub-region.

9. The method of claim 8, wherein the spreading code is applied on a per- symbol basis or a per-subframe basis.

10. The method of claim 1, wherein sub-regions have different associated delta shift values used to determine resources for the physical uplink channel.

11. The method of claim 1, further comprising:
   identifying a frequency hopping pattern; and
   using the frequency hopping pattern to select frequency resources for transmitting symbols of the physical uplink channel in the assigned sub-region.

12. The method of claim 11, wherein the frequency hopping pattern is dependent on a cell ID.

13. The method of claim 12, wherein the frequency hopping pattern is also dependent on at least one of: a subframe index, a slot index, or a symbol index.

14. The method of claim 11, wherein:
   the frequency hopping pattern is used to select a first frequency resource to use for transmitting symbols of the physical uplink channel in the assigned sub-region in a first subframe; and
   the hopping pattern is used to select a second frequency resource to use for transmitting symbols of the physical uplink channel in the assigned sub-region in a second subframe.

15. The method of claim 11, wherein:
   the hopping pattern is used to select a first frequency resource to use for transmitting symbols of the physical uplink channel in the assigned sub-region in a first portion of a subframe; and
   the hopping pattern is used to select a second frequency resource to use for transmitting symbols of the physical uplink channel in the assigned sub-region in a second portion of the subframe.

16. The method of claim 15, wherein:
   the first portion of the first subframe comprises a first slot; and
   the second portion of the first subframe comprises a second slot.

17. The method of claim 11, wherein using the frequency hopping pattern to select frequency resources for transmitting symbols of the physical uplink channel in the assigned sub-region comprises:
   retuning from a first frequency used in a first subframe to a second frequency used in a second subframe, wherein the retuning from the first frequency to the second frequency occurs during a last one or more symbols of the first subframe or a first one or more symbols of the second subframe.

18. The method of claim 17, wherein the UE does not transmit symbols during at least a last symbol of the first subframe or at least a first symbol of the second subframe.

19. The method of claim 17, wherein the UE does not transmit symbols during at least a last symbol of the first subframe and at least a first symbol of the second subframe.

20. The method of claim 11, wherein using the frequency hopping pattern to select frequency resources for transmitting symbols of the physical uplink channel in the assigned sub-region comprises:
   retuning from a first frequency used in a first slot of a subframe to a second frequency used in a second slot of the subframe, wherein retuning from the first frequency to the second frequency occurs during a last one or more symbols of the first slot of the subframe or a first one or more symbols of the second slot of the subframe.

21. The method of claim 20, wherein the UE does not transmit symbols during at least a last symbol of the first slot or a first symbol of the second slot.

22. The method of claim 21, wherein the UE uses a spreading code that is not used by other UEs multiplexed in the narrowband region.

23. The method of claim 20, wherein the UE does not transmit symbols during at least the first slot or the second slot.

24. A method for wireless communications by a base station (BS), comprising:
   identifying at least one narrowband region within a wider system bandwidth;
   signaling, to a user equipment (UE), an indication of a sub-region of the narrowband region assigned to the UE for transmitting symbols of a physical uplink channel that are multiplexed with symbols transmitted by one or more other UEs in the narrowband region, wherein the signaling comprises a resource offset into the narrowband region, wherein different resource offsets into the narrowband region define different sub-regions of the narrowband region, and wherein different resource offsets into the narrowband region are assigned to UEs with coverage enhancement and UEs without coverage enhancement;

signaling a resource index within the sub-region of the narrowband region;

identifying, based on a mapping of the resource index to cyclic shifts, an initial cyclic shift associated with the resource index for transmitting symbols of the physical uplink channel in the assigned sub-region; and receiving the physical uplink channel in the assigned sub-region based on the resource index, the identified initial cyclic shift, and a shift hopping function.

25. The method of claim 24, wherein the resource index varies from at least one of slot to slot or subframe to subframe, according to a resource index hopping pattern function.

26. The method of claim 25, wherein the resource index hopping function depends, at least in part, on an initial resource index.

27. The method of claim 26, wherein the resource index hopping function also depends on a subframe index.

28. The method of claim 25, wherein the resource index hopping function is based on an interleaver function.

29. The method of claim 24, wherein the mapping of values of the resource index to cyclic shifts varies from symbol to symbol within a slot of a subframe according to the shift hopping function.

30. The method of claim 29, wherein the shift hopping function depends, at least in part, on an initial shift index.

31. The method of claim 24, wherein sub-regions have different associated delta shift values used to determine resources for the physical uplink channel.

32. The method of claim 24, further comprising:
identifying a frequency hopping pattern; and
using the frequency hopping pattern to select frequency resources for receiving symbols of the physical uplink channel in the assigned sub-region.

33. The method of claim 32, wherein the frequency hopping pattern is dependent on a cell ID.

34. The method of claim 33, wherein the frequency hopping pattern is also dependent on at least one of: a subframe index, a slot index, or a symbol index.

35. The method of claim 32, wherein:
the frequency hopping pattern is used to select a first frequency resource to use for receiving symbols of the physical uplink channel in the assigned sub-region in a first subframe; and
the hopping pattern is used to select a second frequency resource to use for receiving symbols of the physical uplink channel in the assigned sub-region in a second subframe.

36. The method of claim 32, wherein:
the hopping pattern is used to select a first frequency resource to use for receiving symbols of the physical uplink channel in the assigned sub-region in a first portion of a subframe; and
the hopping pattern is used to select a second frequency resource to use for receiving symbols of the physical uplink channel in the assigned sub-region in a second portion of the subframe.

37. The method of claim 36, wherein:
the first portion of the first subframe comprises a first slot; and
the second portion of the first subframe comprises a second slot.

38. A method for wireless communications by a user equipment (UE), comprising:
identifying at least one narrowband region within a wider system bandwidth;
receiving signaling, from a base station, indicating a sub-region of the narrowband region assigned to the UE for receiving symbols of at least one physical downlink channel that are multiplexed with symbols transmitted by one or more other UEs in the narrowband region, wherein the signaling comprises a resource offset into the narrowband region, wherein different resource offsets into the narrowband region define different sub-regions of the narrowband region, and wherein different resource offsets into the narrowband region are assigned to UEs with coverage enhancement and UEs without coverage enhancement;
determining, based on a mapping of values of a resource index to spreading codes, an spreading code for receiving symbols of the physical downlink channel in the assigned sub- region; and
receiving the physical downlink channel in the assigned sub-region, wherein receiving the physical downlink channel comprises applying the spreading code when receiving symbols of the physical downlink channel in the assigned sub-region.

39. The method of claim 38, wherein the spreading code is applied on a per-symbol basis and can include symbols of multiple slots or subframes.

40. The method of claim 38, wherein:
at least one of the spreading codes is applied in at least one set of symbols; and
symbols in the set are selected based, at least in part, on whether tones in symbols in the set are used for cell-specific reference signals (CRS).

41. The method of claim 40, wherein the set of symbols is selected based on symbols in the set having a same number and location of data tones.

42. The method of claim 38, wherein the at least one physical downlink channel comprises at least one physical downlink shared channel (PDSCH) and at least one physical downlink control channel (PDCCH).

43. The method of claim 42, wherein spreading for the at least one PDSCH is independent of spreading for the at least one PDCCH.

44. The method of claim 43, wherein at least one of different spreading codes or different spreading factors are applied to the at least one PDSCH and the at least one PDCCH.

45. The method of claim 42, wherein the at least one PDCCH is transmitted with a spreading factor of one, as a single transmission spanning multiple subframes.

46. A method for wireless communications by a base station (BS), comprising:
identifying at least one narrowband region within a wider system bandwidth;
signaling, to a user equipment (UE), an indication of a sub-region of the narrowband region assigned to the UE for receiving symbols of a physical downlink channel that are multiplexed with symbols transmitted by one or more other UEs in the narrowband region, wherein the signaling comprises a resource offset into the narrowband region, wherein different resource offsets into the narrowband region define different sub-regions of the narrowband region, and wherein different resource offsets into the narrowband region are assigned to UEs with coverage enhancement and UEs without coverage enhancement;

determining, based on a mapping of values of a resource index to spreading codes, a spreading code for receiving symbols of the physical downlink channel in the assigned sub- region; and transmitting the physical downlink channel in the assigned sub-region, wherein transmitting the physical downlink channel comprises applying the spreading code when transmitting symbols of the physical downlink channel in the assigned sub-region.

47. The method of claim 46, wherein the spreading code is applied on a per-symbol basis and can include symbols of multiple slots or subframes.

48. The method of claim 46, wherein:
at least one of the spreading codes is applied in at least one set of symbols; and
symbols in the set are selected based, at least in part, on whether tones in symbols in the set are used for cell-specific reference signals (CRS).

49. The method of claim 48, wherein the set of symbols is selected based on symbols in the set having a same number and location of data tones.

50. The method of claim 46, wherein the at least one physical downlink channel comprises at least one physical downlink shared channel (PDSCH) and at least one physical downlink control channel (PDCCH).

51. The method of claim 50, wherein spreading for the at least one PDSCH is independent of spreading for the at least one PDCCH.

52. The method of claim 51, wherein at least one of different spreading codes or different spreading factors are applied to the at least one PDSCH and the at least one PDCCH.

53. The method of claim 52, wherein the at least one PDCCH is transmitted with a spreading factor of one, as a single transmission spanning multiple subframes.

* * * * *